(12) United States Patent
Gong et al.

(10) Patent No.: US 12,278,244 B2
(45) Date of Patent: Apr. 15, 2025

(54) DISPLAY PANEL AND METHOD FOR MANUFACTURING THE SAME, DISPLAY APPARATUS AND TILED DISPLAY APPARATUS

(71) Applicants: BOE MLED Technology Co., Ltd., Beijing (CN); BOE TECHNOLOGY GROUP CO., LTD., Beijing (CN)

(72) Inventors: Linhui Gong, Beijing (CN); Chen Li, Beijing (CN); Chao Liu, Beijing (CN); Jiacheng Qi, Beijing (CN)

(73) Assignees: BOE MLED TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/787,985

(22) PCT Filed: May 25, 2021

(86) PCT No.: PCT/CN2021/095872
§ 371 (c)(1),
(2) Date: Jun. 22, 2022

(87) PCT Pub. No.: WO2022/246664
PCT Pub. Date: Dec. 1, 2022

(65) Prior Publication Data
US 2024/0170497 A1 May 23, 2024

(51) Int. Cl.
*H01L 27/12* (2006.01)
*H01L 25/16* (2023.01)
*H01L 33/60* (2010.01)

(52) U.S. Cl.
CPC .......... *H01L 27/124* (2013.01); *H01L 25/167* (2013.01); *H01L 27/1292* (2013.01); *H01L 33/60* (2013.01); *H01L 2933/0058* (2013.01)

(58) Field of Classification Search
CPC ..... H01L 27/124; H01L 25/167; H01L 33/60; H01L 27/15; G09F 9/302; G09F 9/33
See application file for complete search history.

(56) References Cited

U.S. PATENT DOCUMENTS

2012/0122256 A1* 5/2012 Chang .................... H01L 24/97
257/E33.059
2013/0242242 A1 9/2013 Saida
(Continued)

FOREIGN PATENT DOCUMENTS

CN    104821294 A    8/2015
CN    105867689 A    8/2016
(Continued)

OTHER PUBLICATIONS

International Search Report and Written Opinion of the International Searching Authority for International application No. PCT/CN2022/074826 dated Nov. 1, 2022.

*Primary Examiner* — Bac H Au
(74) *Attorney, Agent, or Firm* — XSENSUS LLP

(57) ABSTRACT

A display panel includes: a backplane, a plurality of light-emitting devices, a plurality of connecting leads, a first protective layer and a reflective layer. The backplane includes a first main surface, a second main surface, and a plurality of side surfaces. At least one side surface is as a selected side surface. The plurality of light-emitting devices are disposed on the second main surface and are electrically connected to the plurality of connecting leads. The plurality of connecting leads are disposed on the first main surface, the selected side surface and the second main surface, and each connecting lead sequentially passes through the selected side surface and the second main surface from the first main surface. The first protective layer covers the plurality of connecting leads. The reflective layer includes at (Continued)

least a first portion covering a portion of the first protective layer on the selected side surface.

20 Claims, 20 Drawing Sheets

(56) References Cited

U.S. PATENT DOCUMENTS

| | | | |
|---|---|---|---|
| 2017/0133411 A1 | 5/2017 | Xie et al. | |
| 2018/0175080 A1 | 6/2018 | Shi | |
| 2020/0235189 A1* | 7/2020 | Bae | H10K 59/131 |
| 2021/0135171 A1 | 5/2021 | Sun et al. | |
| 2021/0159219 A1 | 5/2021 | Wang et al. | |
| 2021/0396989 A1 | 12/2021 | Wynne | |
| 2022/0068972 A1* | 3/2022 | Gong | H01L 25/167 |
| 2022/0302362 A1* | 9/2022 | Gong | H01L 27/156 |
| 2022/0384492 A1* | 12/2022 | Lu | H01L 27/15 |
| 2023/0207733 A1* | 6/2023 | Gong | H10K 59/131 |
| | | | 257/79 |
| 2023/0237937 A1* | 7/2023 | Choi | H01L 33/44 |
| | | | 257/79 |
| 2023/0238493 A1* | 7/2023 | Lee | H01L 27/156 |
| | | | 257/79 |
| 2024/0038779 A1* | 2/2024 | Deng | H01L 27/1292 |
| 2024/0097085 A1* | 3/2024 | Wang | H01L 25/167 |
| 2024/0258477 A1* | 8/2024 | Feng | H01L 27/15 |
| 2024/0332458 A1* | 10/2024 | Bai | H01L 33/62 |
| 2024/0395988 A1* | 11/2024 | Wang | H01L 27/15 |

FOREIGN PATENT DOCUMENTS

| | | |
|---|---|---|
| CN | 109599427 A | 4/2019 |
| CN | 110503898 A | 11/2019 |
| CN | 110993775 A | 4/2020 |
| CN | 212256800 U | 12/2020 |
| CN | 113270457 A | 8/2021 |
| CN | 113348561 A | 9/2021 |
| CN | 113547205 A | 10/2021 |
| CN | 113690269 A | 11/2021 |
| CN | 113793859 A | 12/2021 |

* cited by examiner

DISPLAY PANEL AND METHOD FOR MANUFACTURING THE SAME, DISPLAY APPARATUS AND TILED DISPLAY APPARATUS

CROSS-REFERENCE TO RELATED APPLICATION

This application is a national phase entry under 35 USC 371 of International Patent Application No. PCT/CN2021/095872, filed on May 25, 2021, which is incorporated herein by reference in its entirety.

TECHNICAL FIELD

The present disclosure relates to the field of display technologies, and in particular, to a display panel and a method for manufacturing the same, a display apparatus and a tiled display apparatus.

BACKGROUND

In a new-generation display technology, tiny light-emitting diode (LED) chips include micro LED chips and mini LED chips, and are mostly used in seamlessly tiled display apparatuses. Mini LED display apparatuses or micro LED display apparatuses have properties of high contrast, long service life and low power consumption.

At present, the strong commercial demand for a high-end large screen can be achieved through image display of a super-large mini LED display apparatus (or micro LED display apparatus), which is realized by using a certain number of small-sized mini LED display apparatuses (or micro LED display apparatuses). Dimensions of tiled seams of a tiled display apparatus are an important factor affecting a display effect of the tiled display apparatus. Therefore, display apparatuses having narrow bezels have become one of the development trends.

SUMMARY

In an aspect, a display panel is provided. The display panel includes: a backplane, a plurality of light-emitting devices, a plurality of connecting leads, a first protective layer and a reflective layer. The backplane includes a first main surface and a second main surface that are opposite, and a plurality of side surfaces each connecting the first main surface with the second main surface. At least one side surface of the plurality of side surfaces is as a selected side surface. The plurality of light-emitting devices are disposed on the second main surface of the backplane. The plurality of connecting leads are disposed on the first main surface, the selected side surface and the second main surface, and each connecting lead of the plurality of connecting leads sequentially passes through the selected side surface and the second main surface from the first main surface. The plurality of connecting leads being electrically connected to the plurality of light-emitting devices. The first protective layer covers the plurality of connecting leads. The reflective layer includes at least a first portion covering a portion of the first protective layer located on the selected side surface.

In some embodiments, the material of the reflective layer includes metal; or the material of the reflective layer includes metal with reflectivity greater than 80% or alloy with reflectivity greater than 80%.

In some embodiments, a thickness of the reflective layer is in a range from 80 nm to 200 nm, inclusive.

In some embodiments, the reflective layer further includes a second portion. The second portion is disposed on a side, away from the backplane, of a portion of the first protective layer located on the second main surface.

In some embodiments, the reflective layer further includes a third portion. The third portion is disposed on a side, away from the backplane, of a portion of the first protective layer located on the first main surface.

In some embodiments, the display panel further includes a second protective layer disposed on the second main surface of the backplane. The second protective layer covers the plurality of light-emitting devices and fills gap regions between the plurality of light-emitting devices. The second protective layer covers a portion of the first protective layer located on the second main surface.

In some embodiments, a border of the second protective layer proximate to the selected side surface is substantially flush with a plane where the first portion of the reflective layer is located. Or, the reflective layer further includes a second portion, the second portion is disposed on a side, away from the backplane, of the portion of the first protective layer located on the second main surface, and the second protective layer covers a portion of the reflective layer located on the second main surface.

In some embodiments, the selected side surface includes a first transition sub-surface, a second transition sub-surface, and a side sub-surface. The side sub-surface is substantially perpendicular to the first main surface and the second main surface. The first transition sub-surface is connected to the first main surface and the side sub-surface, and the second transition sub-surface is connected to the second main surface and the side sub-surface.

The first portion of the reflective layer includes portions respectively located on the first transition sub-surface, the side sub-surface, and the second transition sub-surface. The second protective layer covers the portion of the first portion of the reflective layer located on the second transition sub-surface. A border of the second protective layer proximate to the selected side surface is substantially flush with a plane where the portion of the first portion of the reflective layer located on the side sub-surface.

In some embodiments, the reflective layer further includes a second portion, the second portion is disposed on a side, away from the backplane, of the portion of the first protective layer located on the second main surface; the second protective layer is disposed on a side of the second portion of the reflective layer away from the backplane, and a border of the second protective layer proximate to the selected side surface corresponds to the second portion of the reflective layer.

In some embodiments, a distance between the border of the second protective layer proximate to the selected side surface and a plane where the first portion of the reflective layer is located is in a range from 20 µm to 30 µm, inclusive.

In some embodiments, a surface of the second protective layer away from the second main surface is substantially parallel to the second main surface.

In some embodiments, the display panel further includes a third protective layer. The third protective layer covers at least a first portion of the reflective layer and a portion of the first protective layer located on the first main surface.

The reflective layer further includes a second portion disposed on a side, away from the backplane, of a portion of the first protective layer located on the second main surface, the third protective layer further covers the second portion; and/or the reflective layer further includes a third portion disposed on a side, away from the backplane, of the portion of the first protective layer located on the first main surface, the third protective layer further covers the third portion.

In some embodiments, the third protective layer further covers a surface of an end of the second protective layer proximate to the selected side surface.

In some embodiments, a material of the third protective layer includes a fluorinating agent.

In some embodiments, a thickness of the third protective layer is in a range from 3 μm to 5 μm, inclusive.

In another aspect, a display apparatus is provided. The display apparatus includes the display panel as described in any of the above embodiments and a driver circuit board. The driver circuit board is disposed on the first main surface of the backplane of the display panel, and the driver circuit board is electrically connected to the plurality of light-emitting devices of the display panel through the plurality of connecting leads of the display panel.

In yet another aspect, a tiled display apparatus is provided. The tiled display apparatus includes a plurality of the display apparatuses as described above. The plurality of the display apparatuses are tiled together.

In yet another aspect, a method for manufacturing a display panel is provided. The method for manufacturing the display panel includes:
 providing a backplane; the backplane including a first main surface and a second main surface that are opposite, and a plurality of side surfaces each connecting the first main surface with the second main surface; and at least one side surface of the plurality of side surfaces being as a selected side surface;
 forming a plurality of connecting leads on the first main surface, the selected side surface and the second main surface; each connecting lead of the plurality of connecting leads sequentially passing through the selected side surface and the second main surface from the first main surface;
 forming a first protective layer on a side of the plurality of connecting leads away from the backplane, the first protective layer covering the plurality of connecting leads;
 forming a reflective layer on a side of the first protective layer away from the backplane, the reflective layer including at least a first portion covering a portion of the first protective layer on the selected side surface; and
 forming a plurality of light-emitting devices on the second main surface, the plurality of light-emitting devices being electrically connected to the plurality of connecting leads.

In some embodiments, forming the reflective layer on the side of the first protective layer away from the backplane includes: sputtering a metal material at least on a side, away from the backplane, of a portion of the first protective layer located on the selected side surface to form the reflective layer.

In some embodiments, the reflective layer further includes a second portion located on a side, away from the backplane, of a portion of the first protective layer located on the second main surface; and forming the reflective layer on the side of the first protective layer away from the backplane includes: sputtering a metal material on a side, away from the backplane, of portions of the first protective layer located on the selected side surface and the second main surface to form the reflective layer; or,
 the reflective layer further includes a third portion located on a side, away from the backplane, of a portion of the first protective layer located on the first main surface;
 and forming the reflective layer on the side of the first protective layer away from the backplane includes: sputtering a metal material on a side, away from the backplane, of portions of the first protective layer located on the selected side surface and the first main surface to form the reflective layer; or,
 the reflective layer further includes a second portion and a third portion; the second portion is located on a side, away from the backplane, of a portion of the first protective layer located on the second main surface; the third portion is located on a side, away from the backplane, of a portion of the first protective layer located on the first main surface; and forming the reflective layer on the side of the first protective layer away from the backplane, includes: sputtering a metal material on a side, away from the backplane, of portions of the first protective layer located on the selected side surface, the second main surface and the first main surface to form the reflective layer.

In some embodiments, the method for manufacturing the display panel further includes: forming a second protective layer after forming the plurality of light-emitting devices on the second main surface.

Forming the second protective layer includes: attaching a second protective film on the second main surface;
 pressing the backplane and the second protective film together using a pressing process; and
 cutting the second protective film along a cutting position on the second protective layer film using a laser cutting process to form the second protective layer with a size matched with a size of the backplane.

The cutting position is parallel to a boundary side between the second main surface and the selected side surface, and the cutting position is substantially flush with a plane where the first portion of the reflective layer is located; or, the reflective layer further includes a second portion located on a side, away from the backplane, of a portion of the first protective layer located on the second main surface, the cutting position is parallel to a boundary side between the second main surface and the selected side surface, and the cutting position corresponds to the second portion.

In some embodiments, the method for manufacturing the display panel further includes: forming a third protective layer after forming the second protective layer.

Forming the third protective layer includes: coating a side of the reflective layer away from the backplane, a side, away from the backplane, of a portion of the first protective layer located on the first main surface, and a surface of an end of the second protective layer proximate to the selected side surface with a fluorinating agent material to form the third protective layer.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal involved in the embodiments of the present disclosure.

DETAILED DESCRIPTION

Figure 1:
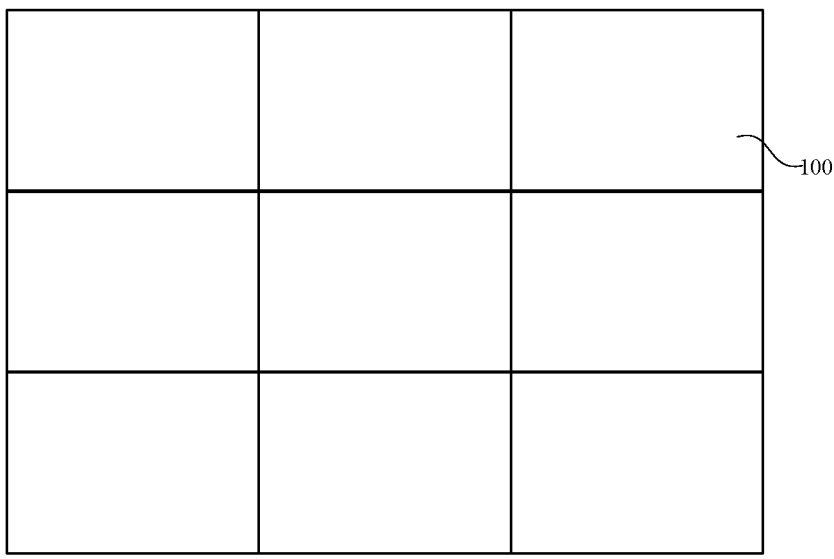
FIG. 1 is a structural diagram of a tiled display apparatus, in accordance with some embodiments of the present disclosure.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or examples(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, the expressions "connected" and "electrically connected" and derivatives thereof may be used. For example, the term "connected" may be used in the description of some embodiments to indicate that two or more components are in direct physical or electrical contact with each other. As another example, the term "electrically connected" may be used in the description of some embodiments to indicate that two or more components are in direct electrical contact. However, the term "electrically connected" may also mean that two or more components are not in direct contact with each other, but still cooperate or interact with each other. The embodiments disclosed herein are not necessarily limited to the content herein.

In addition, the use of the phrase "based on" is meant to be open and inclusive, since a process, step, calculation or other action "based on" one or more of the stated conditions or values may, in practice, be based on additional conditions or value exceeding those stated.

As used herein, the term such as "about", "substantially" or "approximately" includes a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

Exemplary embodiments are described herein with reference to sectional views and/or plan views as idealized exemplary drawings. In the accompanying drawings, thickness of layers and sizes of regions are enlarged for clarity. Variations in shapes relative to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments.

It will be noted that, the embodiments and features in embodiments of the present disclosure may be combined with each other without conflict. Hereinafter, the present disclosure will be described in detail with reference to the accompanying drawings and in combination with the embodiments.

At present, in order to narrow a bezel of a display apparatus, an electrical connection between conductive patterns located on two opposite surfaces of a display panel of the display apparatus may be realized in a side-wiring manner. It is found that leads of the side leads are separate electrical paths. Since the leads are at least composed of a layer of metal material, after the leads are formed by an etching process, regions(s), made of the metal material, of the leads (e.g., section(s) of the leads being etched) will be exposed. The metal material will be gradually corroded in a case of being exposed in water and oxygen for a long time, and corroded regions of the metal material will gradually penetrate inward from the exposed regions. As a result, the side leads may be increased in resistance or even be fractured. Generally, a first protective layer is provided on a side of the side leads away from a backplane of the display panel. The first protective layer covers the side leads, so that the side leads are protected from being corroded by the water and oxygen.

In addition, in order to protect circuit structures located in a display region and on a light-emitting side of the display panel, the display panel further includes a second protective layer disposed on the light-emitting side of the display panel. The second protective layer may protect both the circuit structures and light-emitting elements. Further, the second protective layer may be in a dark color, such as black, dark gray or dark green, which is capable of improving a contrast of a display image. In a process of cutting a second protective film by a laser cutting technology to obtain the second protective layer that is matched with a size of the display panel, laser light is likely to cut the first protective layer on the side leads or even the side leads, which may cause the side leads being directly exposed to air, and thus the side leads are easily corroded and even short-circuited or open-circuited.

Some embodiments of the present disclosure provide a tiled display apparatus 1000. As shown in FIG. 1, the tiled display apparatus 1000 includes a plurality of small-sized display apparatuses 100. The plurality of display apparatuses 100 are tiled together. A bezel of each display apparatus 100 for being tiled has a very small size, for example, no more than a half of a distance between two adjacent pixels of each display apparatus. Therefore, tiled seam(s) each between two adjacent display apparatuses 100 is less visible to eyes within a viewing range when the tiled display apparatus 1000 is actually viewed in practice. As a result, a good display effect may be presented.

As shown in FIGS. 2A to 4, the display apparatus 100 includes a display panel and a driver circuit board 20. The display panel 10 includes a backplane 1, a plurality of connecting leads 4 and a plurality of light-emitting devices 2. The driver circuit board is disposed on a first main surface 1a of the backplane 1 of the display panel 10. The driver circuit board 20 is electrically connected to the plurality of light-emitting devices 2 of the display panel 10 through the plurality of connecting leads 4 of the display panel 10.

Figure 2A:
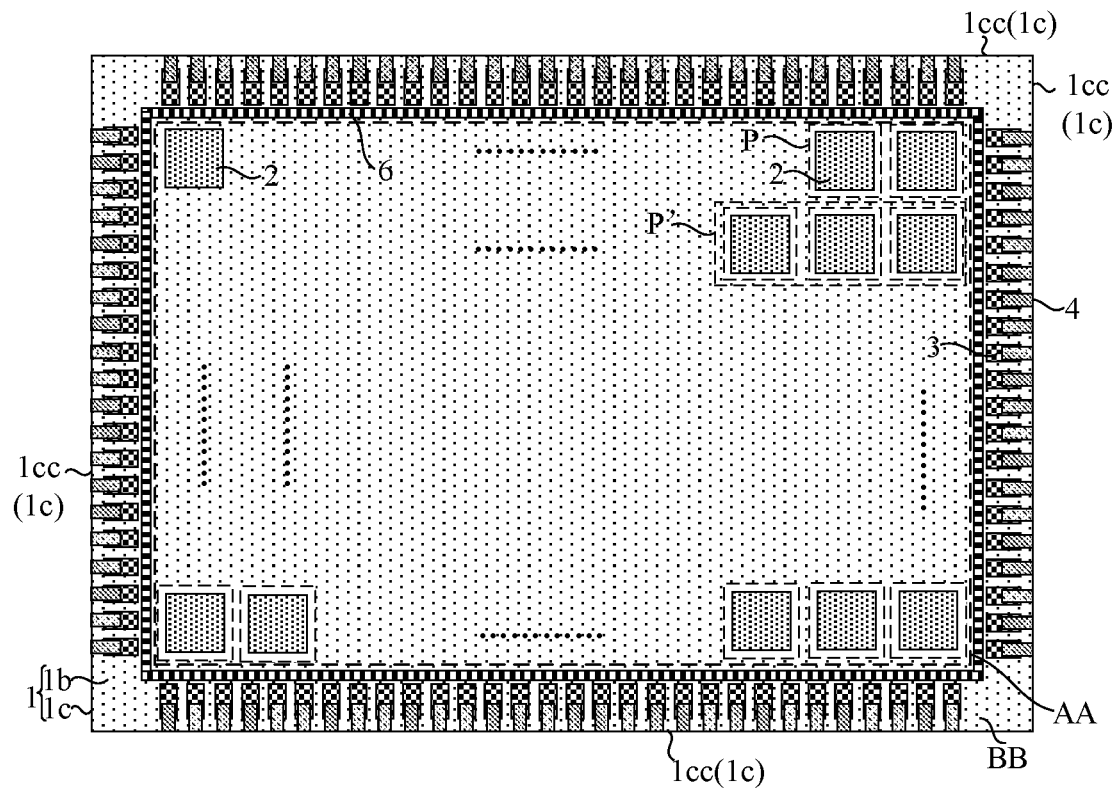
FIG. 2A is a structural diagram of a display panel, in accordance with some embodiments of the present disclosure.
Figure 2B:
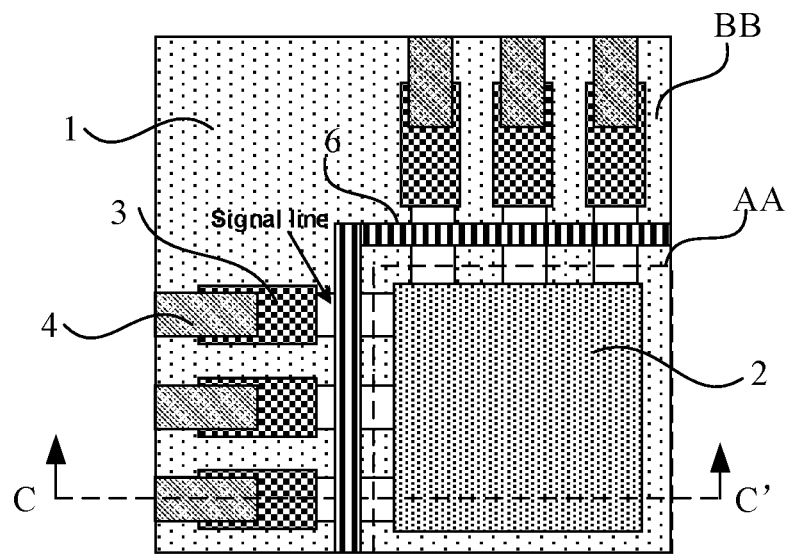
FIG. 2B is a partial structural diagram of the display panel in FIG. 2A.
Figure 4:
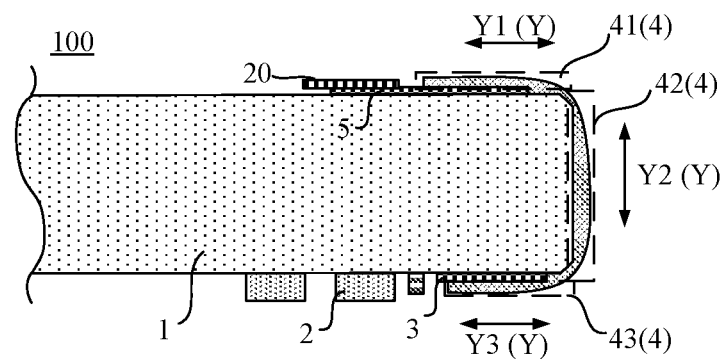
FIG. 4 is a sectional view of the partial structural diagram of the display panel in FIG. 2B taken along the line CC'.

In some embodiments, as shown in FIGS. 2A, 2B and 4, the display panel 10 further includes a plurality of first electrodes 3 and a plurality of second electrodes 5. The plurality of first electrodes 3 are electrically connected to the plurality of connecting leads 4, respectively. The plurality of second electrodes 5 are electrically connected to the plurality of connecting leads 4, respectively. The driver circuit board 20 is electrically connected to the plurality of second electrodes 5, so as to be electrically connected to the plurality of connecting leads 4 through the plurality of second electrodes 5. Thus, an electrical connection between the driver circuit board 20 and the plurality of light-emitting devices 2 may be realized.

In the tiled display apparatus 1000 formed by tiling the plurality of display apparatuses 100, the smaller the tiled seam between adjacent display apparatuses 100, the better the image display effect of the tiled display apparatus 1000. The mini LED display apparatus or the micro LED display apparatus adopts the side-wiring manner, which may reduce a width of the bezel of the display apparatus 100 and a width of the tiled seam. Therefore, by packaging the side leads of the display panel 10 of the display apparatus 100, it may be possible to prolong a service life of the tiled display apparatus 1000 for image display.

In some embodiments, the display apparatus 100 is the mini LED display apparatus or the Micro LED display apparatus.

As shown in FIG. 2A, in some embodiments, the display panel 10 includes a display region AA (also referred to as an active region) and a peripheral region BB located on at least one side of the display region AA.

In the display panel 10, the display region AA is provided with a plurality of pixels P' and a plurality of signal lines therein. The plurality of pixels P' are electrically connected to the plurality of signal lines. For example, each pixel includes sub-pixels P of at least three colors. The sub-pixels P of colors include at least a sub-pixel of a first color, a sub-pixel of a second color and a sub-pixel of a third color. The first color, the second color and the third color are three primary colors (such as red, green and blue).

As shown in FIGS. 3 to 6, in some embodiments, the display panel 10 includes the backplane 1, the plurality of light-emitting devices 2 and the plurality of connecting leads 4.

Figure 3:
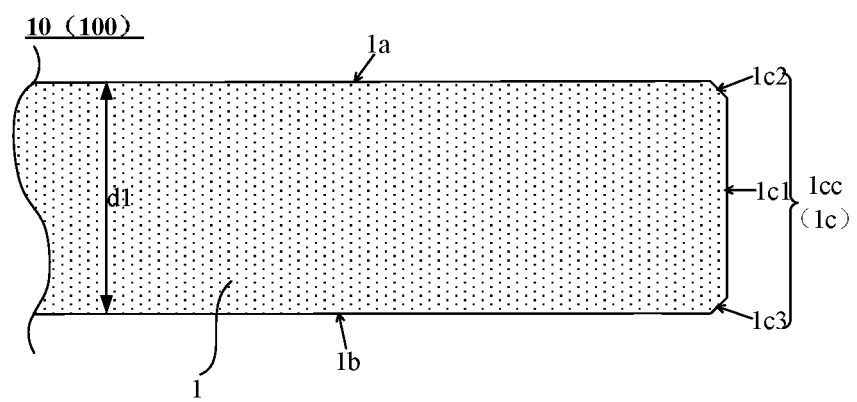
FIG. 3 is a sectional view of a display panel, in accordance with some embodiments of the present disclosure.

Referring to FIG. 3, the backplane 1 includes the first main surface 1a and a second main surface 1b that are opposite, and a plurality of side surfaces 1c each connecting the first main surface 1a to the second main surface 1b. At least one side surface 1c of the plurality of side surfaces 1c is a selected side surface 1cc. As shown in FIGS. 2A, 2B and 3, the first main surface 1a and the second main surface 1b of the backplane 1 are each, for example, in a rectangular shape, and the backplane 1 includes four side surfaces 1c.

As shown in FIGS. 3 and 4, in some examples, the selected side surface 1cc includes a side sub-surface 1c1, a first transition sub-surface 1c2, and a second transition sub-surface 1c3. The side sub-surface 1c1 is perpendicular or substantially perpendicular to the first main surface 1a and the second main surface 1b. The first transition sub-surface 1c2 is connected to the first main surface 1a and the side sub-surface 1c1. The second transition sub-surface 1c3 is connected to the second main surface 1b and side sub-surface 1c1.

For example, the backplane 1 includes a substrate and a driving circuit layer disposed on a side of the substrate. The substrate may be made of a rigid material such as glass, quartz or plastic. The driving circuit layer includes structures such as thin film transistors (TFTs) or micro driver chips, and the plurality of signal lines. The driving circuit layer is coupled to the plurality of light-emitting devices 2, and is configured to drive the plurality of light-emitting devices 2 to emit light.

As shown in FIG. 3, a thickness d1 of the backplane 1 is in a range from 0.5 mm to 1 mm, inclusive. For example, the thickness d1 of the backplane 1 is 0.5 mm, 0.7 mm, or 1 mm.

As shown in FIGS. 2A to 4, the plurality of light-emitting devices 2 are disposed on the second main surface 1b of the backplane 1. The light-emitting devices 2 include but are not limited to organic light-emitting diodes (OLEDs), quantum dot light-emitting diodes (QLEDs), mini LEDs or micro LEDs. For example, each sub-pixel P includes at least one light-emitting device 2.

As shown in FIG. 4, the plurality of connecting leads 4 are disposed on the first main surface 1a, the selected side surface 1cc and the second main surface 1b of the backplane. Each connecting lead 4 of the plurality of connecting leads 4 sequentially passes through the selected side surface 1cc and the second main surface 1b from the first main surface 1a. Each connecting lead 4 includes a first portion 41 located on the first main surface 1a, a second portion 42 located on the selected side surface 1cc and a third portion 43 located on the second main surface 1b.

The plurality of connecting leads 4 are configured to connect the first main surface 1a and the second main surface 1b of the backplane. For example, the plurality of light-emitting devices 2 are electrically connected to the driver circuit board 20 that is on a back surface of the display panel 10 through the plurality of connecting leads 4, so that the driver circuit board 20 may provide electrical signals to control the plurality of light-emitting devices 2 to emit light.

Figure 5:
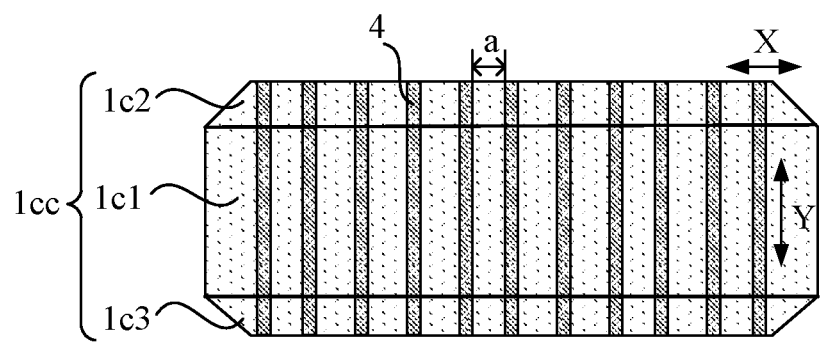
FIG. 5 is a structural diagram of a plurality of connecting leads of a display panel, in accordance with some embodiments of the present disclosure.

As shown in FIG. 5, in some embodiments, the plurality of connecting leads 4 are arranged in parallel and spaced apart from each other, and each connecting lead 4 extends in a length direction Y thereof. It will be noted that, as shown in FIG. 4, since each connecting lead 4 includes the first portion 41, the second portion 42 and the third portion 43, each of which has a respective length direction (i.e., a length direction Y1, a length direction Y2 and a length direction Y3), and the length direction Y represents an extending direction of the whole connecting lead 4. A width of each connecting lead 4 is not limited and is related to a size of a structure electrically connected to the connecting lead 4, and it may be selectively set according to actual needs.

Figure 6:
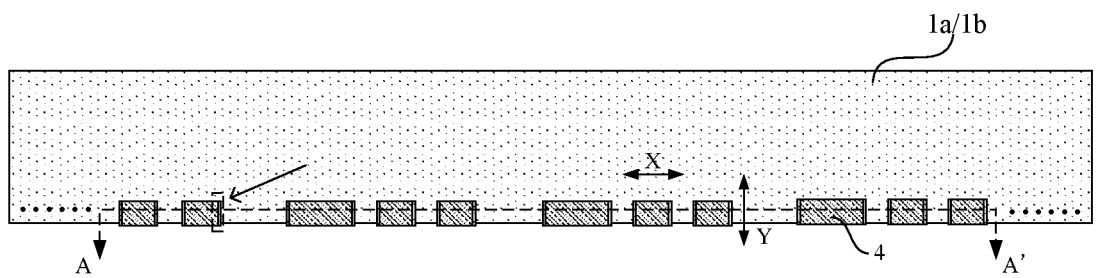
FIG. 6 is a partial structural diagram of a display panel, in accordance with some embodiments of the present disclosure.
Figure 7:
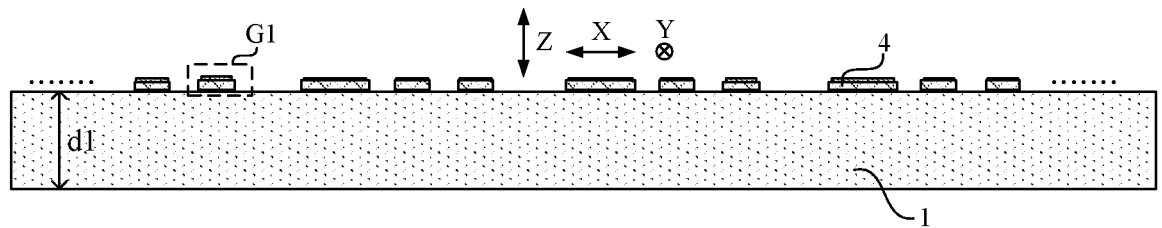
FIG. 7 is a sectional view of the display panel in FIG. 6 taken along the line AA'.
Figure 8:
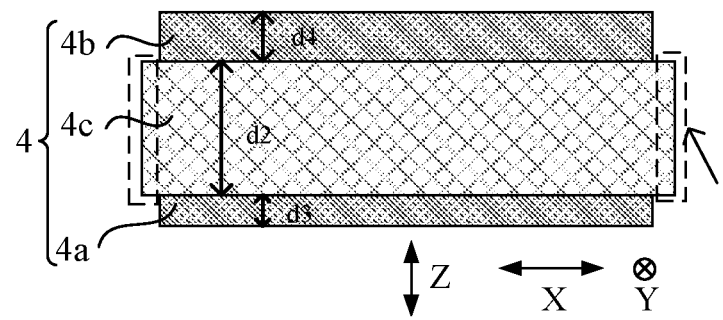
FIG. 8 is an enlarged view of the region G1 in FIG. 7.

In some embodiments, as shown in FIGS. 6 to 8, where FIG. 7 is a sectional view of a partial region of the display panel 10 according to the sectional line AA' shown in FIG. 6, each connecting lead 4 includes a stacked structure of a main conductive pattern 4c, a first buffer conductive pattern 4a and a second buffer conductive pattern 4b. The first buffer conductive pattern 4a, the main conductive pattern 4c and the second buffer conductive pattern 4b are stacked in sequence. The first buffer conductive pattern 4a is closer to the backplane 1 than the main conductive pattern 4c. An adhesion between the first buffer conductive pattern 4a and the backplane 1 is greater than an adhesion of the main conductive pattern 4c and the backplane 1. An oxidation resistance of the second buffer conductive pattern 4b is better than an oxidation resistance of the main conductive pattern 4c.

The first buffer conductive pattern 4a, the main conductive pattern 4c and the second buffer conductive pattern 4b are all conductive. The main conductive pattern 4c has a relatively strong electrical conductivity and a relatively low resistivity. The main conductive pattern 4c is made of, for example, copper (Cu). On a premise of ensuring that the plurality of connecting leads 4 have the relatively strong electrical conductivity and relatively low signal loss to achieve stable signal transmission, by respectively arranging the first buffer conductive pattern 4a and the second buffer conductive pattern 4b on two sides of the main conductive pattern 4c of each connecting lead 4, it is possible to enhance an adhesion between the plurality of connecting leads 4 and the backplane 1, so that the plurality of connecting leads 4 are not easy to fall off. Moreover, the second buffer conductive pattern 4b may protect the main conductive pattern 4c, which may enhance the oxidation resistance of the plurality of connecting leads 4, so that the plurality of connecting leads 4 are not easily corroded by the water and oxygen, and thus the service life of the display panel is prolonged.

In some examples, the first buffer conductive pattern 4a is made of a material having a strong adhesion, for example, a material having a strong bonding force with glass. The second buffer conductive pattern 4b is made of a material having a strong oxidation resistance. For example, a material of the first buffer conductive pattern 4a includes any of titanium (Ti), chromium (Ge), molybdenum (Mo), and a molybdenum-niobium alloy (MoNb), and a material of the second buffer conductive pattern 4b includes any of Ti, Ge, Mo, and the MoNb alloy. For example, the material of the first buffer conductive pattern 4a is the same as the material of the second buffer conductive pattern 4b, and materials of the first buffer conductive pattern 4a and the second buffer conductive pattern 4b are both Ti, Ge, Mo or the MoNb alloy.

It can be understood that, the first buffer conductive pattern 4a and the second buffer conductive pattern 4b may be made of a mixed material of Ti and Ge, a mixed material of Ti, Ge and Mo, or the like.

In some examples, the first buffer conductive pattern 4a and the second buffer conductive pattern 4b are each made of elemental metal, such as Ti. In this case, the first buffer conductive pattern 4a and the main conductive pattern 4c has an alloy (e.g., a TiCu alloy) therebetween, and the second buffer conductive pattern 4b and the main conductive pattern 4c has another alloy (e.g., another TiCu alloy) therebetween. As a result, an adhesion between a material layer of the first buffer conductive pattern 4a and a material layer of the main conductive pattern 4c, and an adhesion between a material layer of the second buffer conductive pattern 4b and the material layer of the main conductive pattern 4c may be increased. For example, the first buffer conductive pattern 4a and the second buffer conductive pattern 4b are each made of Ti, the main conductive pattern 4c is made of Cu, the TiCu alloy is provided between the first buffer conductive pattern 4a and the main conductive pattern 4c, the another Ti—Cu alloy is provided between the second buffer conductive pattern 4b and the main conductive pattern 4c, so each connecting lead 4 is of the stacked structure including five layers.

In some examples, as shown in FIG. 8, a thickness d2 of the main conductive pattern 4c is in a range from 0.4 μm to 1 μm, inclusive. For example, the thickness d2 of the main conductive pattern 4c is 0.4 μm, 0.6 μm or 1 μm. A thickness d3 of the first buffer conductive pattern 4a is in a range from 30 μm to 70 μm, inclusive. For example, the thickness d3 of the first buffer conductive pattern 4a is 30 nm, 50 nm or 70 nm. A thickness d4 of the second buffer conductive pattern 4b is in a range from 50 nm to 120 nm, inclusive. For example, the thickness d4 of the second buffer conductive pattern 4b is 50 nm, 80 nm or 120 nm.

In some embodiments, a method for manufacturing the plurality of connecting leads 4 is that metal layers are deposited on the first main surface 1a, the selected side surface 1cc, and the second main surface 1b of the backplane 1 to form a first buffer conductive layer, a main conductive layer and a second buffer conductive layer sequentially, and then these layers are patterned by an etching process to obtain the plurality of connecting leads 4. The etching process may adopt wet etching or laser etching.

In this way, as shown in FIGS. 7 and 8, after the etching process is finished, the main conductive pattern 4c on both sides of each connecting lead 4 in a width direction X thereof are exposed (referring to the structures within the dotted boxes in FIGS. 6 and 8). The thicknesses of the first buffer conductive pattern 4a and the second buffer conductive pattern 4b are much thinner than the thickness of the main conductive pattern 4c. Thus, when the stacked structure of the first buffer conductive layer, the main conductive layer and the second buffer conductive layer is patterned by the etching process, both the first buffer conductive patterns 4a and the second buffer conductive patterns 4b of the formed plurality of connecting leads 4 are over-etched, and the second buffer conductive patterns 4b are over-etched more seriously. In addition, since the thickness of the main conductive layer is relatively large, each connecting lead 4 formed has large exposed surfaces on both sides of the connecting lead 4 in the width direction X thereof, and thus the main conductive pattern 4c is exposed more seriously (referring to the exposed surfaces of the main conductive pattern 4c within the dotted boxes indicated by the arrows in FIGS. 6 and 8). As a result, the exposed regions of the main conductive pattern 4c will be gradually corroded in a condition of being exposed in the water and oxygen for a long time without the protection of the second buffer conductive pattern 4b, and the corroded regions gradually penetrate inward from the exposed positions, so that the connecting lead may be increased in resistance or even be fractured.

It can be understood that, since each connecting lead 4 is of a sandwich structure in which the first buffer conductive pattern 4a, the main conductive pattern 4c and the second buffer conductive pattern 4b are stacked in sequence, the main conductive pattern 4c on both sides of each connecting lead 4 in the length direction Y thereof may be exposed.

It will be noted that the width direction X of each connecting lead 4 is perpendicular to the length direction Y thereof. That is, the width direction X of each connecting lead 4 is perpendicular to a direction in which the connecting lead 4 extends. In addition, the width direction X of each connecting lead 4 is parallel to a plane of a surface, on which the connecting lead 4 is located, of the backplane 1. For example, the width direction X of a portion located on the selected side surface 1cc of each connecting lead 4 is perpendicular to the length direction Y (i.e., the length direction Y2) of the portion located on the selected side surface 1cc of each connecting lead 4, and is parallel to a plane where the selected side surface 1cc is located. The width direction X of a portion located on the first main surface 1a of each connecting lead 4 is perpendicular to the length direction Y (i.e., the length direction Y1) of the portion located on the first main surface 1a of each connecting lead 4, and is parallel to a plane where the first main surface 1a is located. The width direction X of a portion located on the second main surface 1b of each connecting lead 4 is perpendicular to the length direction Y (i.e., the length direction Y3) of the portion located on the second main surface 1b of each connecting lead 4, and is parallel to a plane where the second main surface 1b is located.

Figure 9:
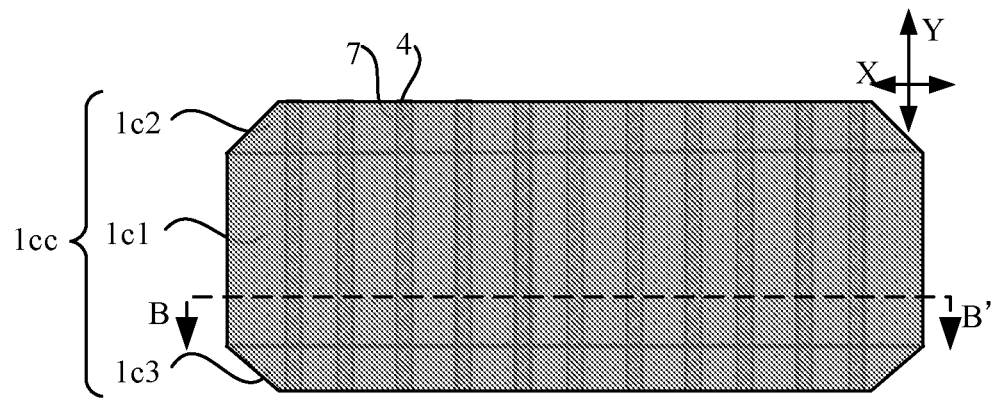
FIG. 9 is a structural diagram of a protective layer of a display panel, in accordance with some embodiments of the present disclosure.
Figure 10:
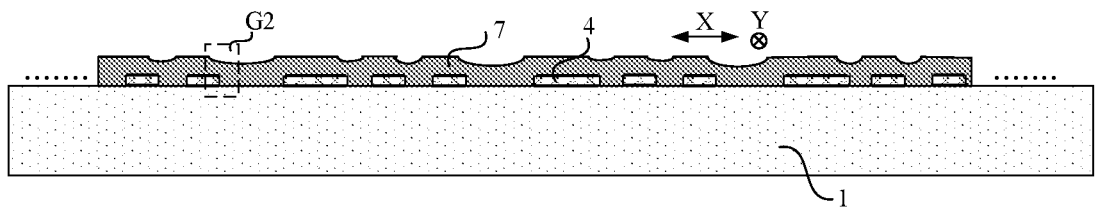
FIG. 10 is a sectional view of the display panel in FIG. 9 taken along the line BB'.
Figure 11:
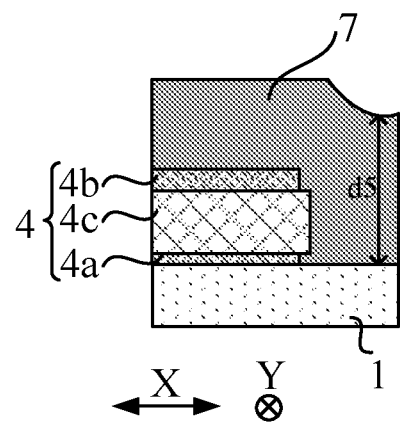
FIG. 11 is an enlarged view of the region G2 in FIG. 10.

Based on this, as shown in FIGS. 9 to 11, in some embodiments, the display panel 10 further includes a first protective layer 7. The first protective layer 7 covers the plurality of connecting leads 4. The first protective layer 7 is disposed on a side of the plurality of connecting leads 4 away from the backplane 1, so as to isolate the main conductive pattern 4c from an outside. In this way, the first protective layer 7 may not only protect the exposed portions of the main conductive pattern 4c, which are on both sides of each of the plurality of connecting leads 4 in the width direction X of the connecting leads, but also cover an entirety of the plurality of connecting leads 4, thus avoiding the plurality of connecting leads 4 being corroded and prolonging the service life of the display panel.

The first protective layer 7 is made of a material with a strong oxidation resistance, which may block the water and oxygen from the outside, and thus prevent the main conductive patterns 4c from being corroded. For example, the material of the first protective layer 7 includes an over coating (OC) adhesive or a dark ink material. The OC photoresist includes a black adhesive or a white adhesive. For example, the first protective layer 7 is a black adhesive layer. The dark ink material has properties of high hardness and good a corrosion resistance, and may cover the exposed portions of the main conductive pattern 4c, which are on both sides of each of the plurality of connecting leads 4 in the width direction X of the connecting leads, so as to protect the connecting leads 4 well.

Figure 12:
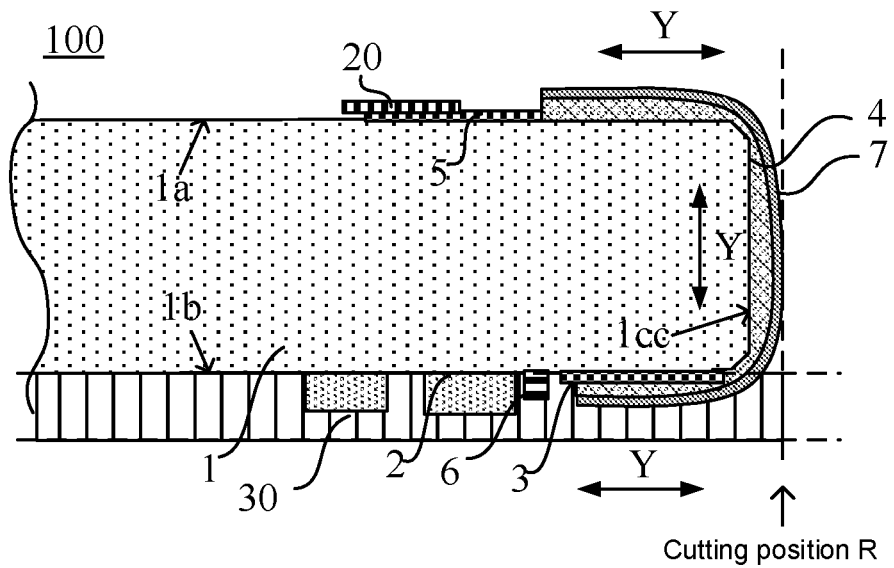
FIG. 12 is a sectional view of a display panel with a protective layer, in accordance with some embodiments of the present disclosure.

In some embodiments, as shown in FIGS. 10, 11 and 12, thicknesses d5 of portions of the first protective layer 7 located on the first main surface 1a, the selected side surface 1cc and the second main surface 1b are each in a range from 5 μm to 8 μm, inclusive. For example, a thickness of the first protective layer 7 may be 5 μm, 7 μm or 8 μm. In this way, it may be possible to ensure an adhesion between the first protective layer 7 and the connecting leads 4, and a protective effect of the first protective layer 7 on the plurality of connecting leads 4.

Thicknesses of portions of the first protective layer 7 located on the first main surface 1a and the second main surface 1b are each a dimension of the first protective layer 7 in a direction perpendicular to a plane where the backplane 1 is located, and a thickness of a portion of the protective layer 7 located on the selected side surface 1cc is a dimension of the first protective layer 7 in a direction perpendicular to the selected side surface 1cc.

In some embodiments, as shown in FIGS. 2A, 2B and 4, the display panel 10 further includes the plurality of first electrodes 3 and the plurality of second electrodes 5. The plurality of second electrodes 5 are disposed on the first main surface 1a of the backplane, each second electrode 5 is electrically connected to a portion of a connecting lead 4 located on the first main surface 1a, and each second electrode 5 is electrically connected to the driver circuit board 20, so as to control signal transmission of the corresponding connecting lead 4 by the driver circuit board.

The plurality of first electrodes 3 are disposed on the second main surface 1b of the backplane 1, each first electrode 3 is electrically connected to a portion of a connecting lead 4 located on the second main surface 1b, and each first electrode 3 is electrically connected to a respective light-emitting device 2, so as to transmit a signal transmitted on the connecting lead 4 to the respective light-emitting device 2 for image display.

In some embodiments, as shown in FIGS. 2A and 12 to 23, the display panel 10 further includes a barrier wall 6. The barrier wall 6 is disposed in the peripheral region BB of the backplane 1 and in gap regions each between the plurality of light-emitting devices 2 and the plurality of second electrodes 3. For example, as shown in FIG. 2A, the barrier wall 6 may be disposed on a periphery of the display region AA, such as surrounding the display region AA. Alternatively, the barrier wall 6 may be disposed only on side(s) of the peripheral region BB proximate to the selected side surface(s) 1cc.

The barrier wall 6 is formed before the plurality of connecting leads 4, so that in a process of forming the plurality of connecting leads 4 (e.g., during sputtering a material of the plurality of connecting leads 4 by a sputtering process), the barrier wall 6 may prevent the material of the plurality of connecting leads 4 from being sputtered into the display region AA of the display panel 10, which may affect the manufacturing precision of elements in the display region AA.

In some examples, a thickness of the barrier wall 6 is greater than the thickness of the portions of the plurality of connecting leads 4 located on the second main surface 1b, and is smaller than a total of the thickness of the portions of the plurality of connecting leads 4 and a thickness of film layer(s) stacked on a surface of portions of the plurality of connecting leads 4. For example, the thickness of the barrier wall 6 is in a range from 3 µm to 10 µm, inclusive. For example, the thickness of the barrier wall 6 is 7 µm or 10 µm.

In some examples, a material of the barrier wall 6 is not limited, as long as the material of the plurality of connecting leads 4 may be prevented from being sputtered into the display region AA. For example, the barrier wall 6 is made of an elastic material. For example, the elastic material may be a resin material, or a stack of the resin material and a material of metal film layer(s).

In some embodiments, as shown in FIG. 12, the display panel 10 further includes a second protective layer 30. The second protective layer 30 is disposed on the second main surface 1b of the backplane 1, covers the plurality of light-emitting devices 2 and fills gap regions between the plurality of light-emitting devices 2.

In some embodiments, the second protective layer 30 further covers the plurality of first electrodes 3 and fills gap regions between the plurality of first electrodes 3. The second protective layer 30 further covers a portion of the first protective layer 7 located on the second main surface 1b, so as to further protect the circuit structures. For example, the second protective layer 30 may protect the plurality of light-emitting devices 2 and avoid damages due to bump of the light-emitting devices caused by subsequent processes.

In some examples, a material of the second protective layer 30 has a high light transmittance and a dark color. For example, the second protective layer 30 may be made of black silica gel or black resin. Thus, while protecting the plurality of light-emitting devices 2, it may be possible to ensure a light-emitting efficiency of the plurality of light-emitting devices 2, and avoid a reduction of contrast of an image caused by reflection of external ambient light after being incident on, for example, a metal material pattern of the display panel, thereby improving the contrast thereof.

In some embodiments, the material for example, a black adhesive material, of the second protective layer 30 may be attached to the second main surface 1b of the backplane 1 to form a second protective film Then the second protective film is pressed, and thus an area of the second protective film is greater than an area of the second main surface 1b of the backplane 1. The second protective film is cut through a laser process later, for example, using a gas laser. For example, the second protective film is cut by infrared laser light generated by a carbon dioxide ($CO_2$) laser. As a result, the second protective layer 30 is formed, and a size of the second protective layer 30 is matched with a size of the backplane.

In the above cutting step, the cutting process need to be performed along a preset cutting line, for example, a cutting position R on the second protective film. In this way, it is possible to ensure a tiled effect of the plurality of display apparatuses, and avoid damages to other layer(s) of the display apparatus during laser cutting.

For example, an overlapping region between the cutting position R on the second protective film and film structure on the backplane is reduced as much as possible. For example, the cutting position R exceeds a plane where an outermost film structure (e.g., the first protective layer 7) on the selected side surface of the backplane is located by a certain distance, and the distance is in a range from, for example, 35 µm to 70 µm, inclusive. In this way, an edge of the formed second protective layer 30 exceeds an edge of the display panel 100. In a subsequent process of tiling the plurality of display apparatuses 100 to form the tiled display apparatus 1000, as for two adjacent display apparatuses 100, cases are as follows: in a case where two adjacent second protective layers 30 are in direct contact with each other, wrinkled edges may exist at a position of the tiled seam between two second protective layers 30 of the corresponding two display apparatuses 100; and in a case where the two adjacent second protective layers 30 have a gap therebetween, a depression region may exist at the position of the tiled seam between the corresponding two display apparatuses 100. In any of the cases, a flatness of the entire tiled display apparatus may be decreased, and thus the yield of the tiled display apparatus may be affected.

The cutting position R on the second protective film is flush with the portion of the first protective layer 7 on the selected side surface 1cc. In a laser cutting process, it is easy to cut the portion of the first protective layer 7 on the selected side surface 1cc of the backplane 1 in a case of an extensive laser energy, which may lead to the damage of the first protective layer 7, and further cause the connecting leads 4 to be corroded by the water and oxygen due to the exposure to the air; alternatively, it is possible to cut off the connecting lead(s) 4, which may lead to open circuits.

Figure 13:
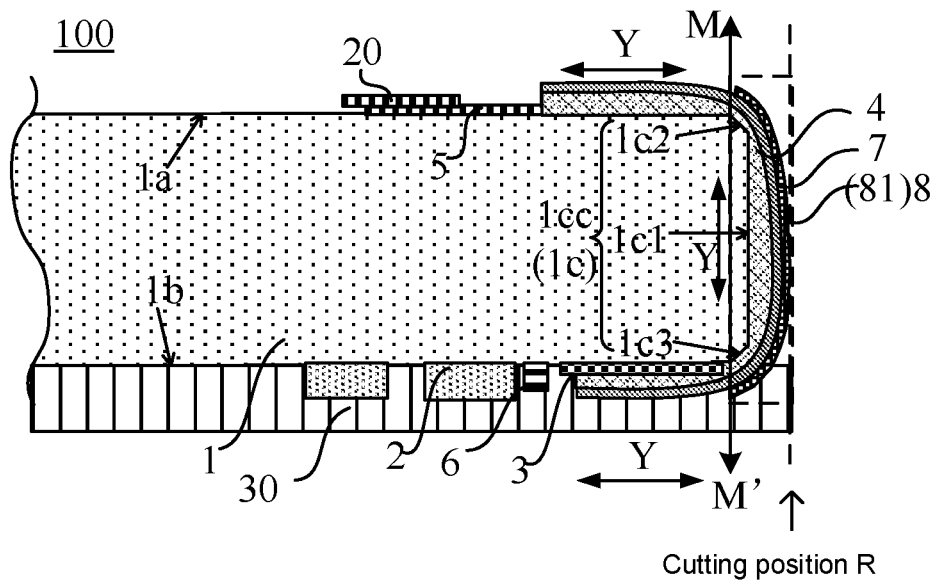
FIG. 13 is a sectional view of a display panel with a reflective layer, in accordance with some embodiments of the present disclosure.

Based on this, as shown in FIG. 13, in some embodiments, the display panel 10 further includes a reflective layer 8. The reflective layer 8 includes at least a first portion 81 covering the portion of the first protective layer 7 on the selected side surface 1cc. Referring to FIGS. 13 to 14B, in a direction MM' perpendicular to the plane where the first main surface 1a of the backplane 1 is located, a border of the first portion 81 of the reflective layer 8 coincides with a border of the selected side surface 1cc.

The reflective layer 8 is configured to reflect the laser light in the laser cutting process, thus preventing the laser light from causing damage to film layers located inside the reflective layer, so as to protect the portions of the plurality of connecting leads 4 on the selected side surface.

In some embodiments, as shown in FIGS. 13 and 14B, in the laser cutting process, the cutting position R on the second protective film is flush with a plane where the first portion 81 of the reflective layer is located. In this way, after the laser light is incident on the first portion 81 of the reflective layer 8, the first portion 81 may reflect the laser light to avoid the damage of the laser energy to the film layers inside the reflective layer 8. Thus, a border of the formed second protective layer 30 proximate to the selected side surface 1cc is flush or substantially flush with the plane where the first portion 81 of the reflective layer 8 is located.

In some embodiments, with continued reference to FIG. 13, in the case where the selected side surface includes the first transition sub-surface 1c2, the side sub-surface 1c1 and the second transition sub-surface 1c3, the reflective layer 8 includes the first portion 81 located on the first transition sub-surface 1c2, the side sub-surface 1c1 and the second transition sub-surface 1c3. The second protective layer 30 covers a portion of the reflective layer 8 located on the second transition sub-surface 1c3. The border of the second protective layer 30 proximate to the selected side surface 1cc is flush or substantially flush with a plane where a portion of the reflective layer 8 on the side sub-surface 1c1 is located.

It will be explained that, the first portion 81 of the reflective layer 8 includes portions respectively located on the first transition sub-surface 1c2, the side sub-surface 1c1 and the second transition sub-surface 1c3, the three portions are not in a same plane perpendicular to the first main surface 1b, and a surface of the first portion 81 is not completely flat. Therefore, a description that the cutting position R on the second protective film is flush with the plane where the first portion 81 of the reflective layer 8 is located means that the cutting position R is tangent to an outer surface of the first portion 81 and parallel to a direction perpendicular to the first main surface, so that the border of the second protective layer 30 proximate to the selected side surface 1cc is flush or substantially flush with the plane where the portion of the reflective layer 8 on the side sub-surface 1c1 is located.

Figure 14A:
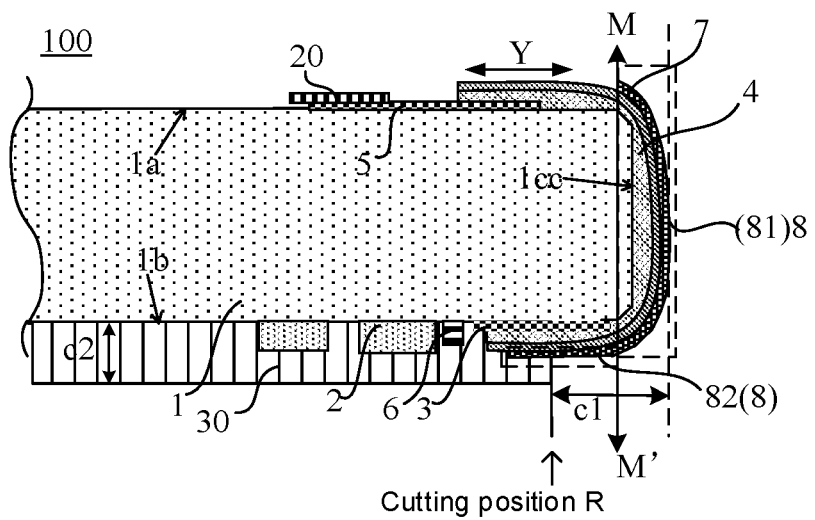
FIG. 14A is a sectional view of another display panel with a reflective layer, in accordance with some embodiments of the present disclosure.
Figure 14B:
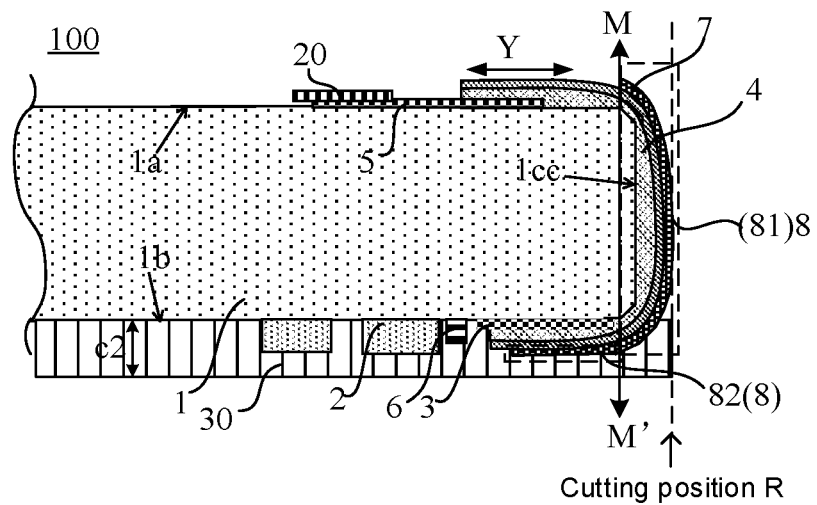
FIG. 14B is a sectional view of another display panel with a reflective layer, in accordance with some embodiments of the present disclosure.

In some other embodiments, as shown in FIGS. 14A and 14B, the reflective layer 8 further includes a second portion 82. The second portion 82 is disposed on a side, away from the backplane 1, of the portion of the first protective layer 7 located on the second main surface 1b. The second protective layer 30 covers the portion of the reflective layer 8 located on the second main surface 1b.

In some examples, with continued reference to FIG. 14A, in the case where the reflective layer 8 further includes the second portion 82, in the laser cutting process, the cutting position R on the second protective film corresponds to the second portion 82 of the reflective layer 8. In this way, after the laser light is incident on the second portion 82 of the reflective layer 8, the second portion 82 may reflect the laser light to avoid the damage of the laser energy to the film layers inside the reflective layer 8. Thus, the border of the second protective layer 30 proximate to the selected side surface 1cc corresponds to the second portion 82 of the reflective layer 8.

For example, as shown in FIG. 14A, a distance between the border of the second protective layer 30 proximate to the selected side surface 1cc and the plane where the first portion 81 of the reflective layer 8 is located in in a range from 20 μm to 30 μm, inclusive. For example, the distance c1 between the border of the second protective layer proximate to the selected side surface 1cc and the plane where the first portion 81 of the reflective layer 8 is located is 20 μm or 30 μm. Thus, the distance c1 between the border of the second protective layer 30 proximate to the selected side surface 1cc and the plane where the first portion 81 of the reflective layer 8 is located may be set within a reasonable range. In this way, in a subsequent process where the plurality of display apparatuses 100 are tiled together, it is possible to avoid a situation that a depression exists in a tiled seam between the two adjacent display apparatuses due to an extremely long distance (which is, for example, 60 μm or 100 μm) between the border of the second protective layer 30 proximate to the selected side surface 1cc and the plane where the side sub-surface 1c1 is located.

In some other examples, as shown in FIG. 14B, in the case where the reflective layer 8 further includes the second portion 82, the border of the second protective layer proximate to the selected side surface 1cc is flush or substantially flush with the plane where the portion of the reflective layer 8 on the side sub-surface 1c1 is located.

Figure 15:
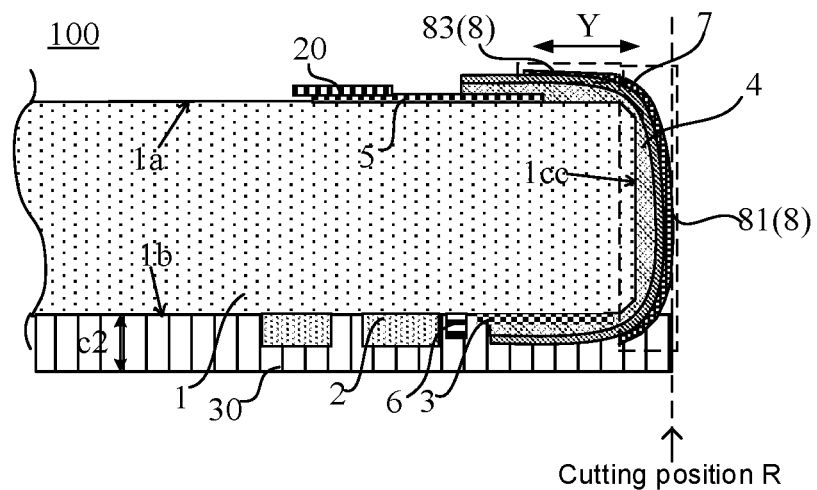
FIG. 15 is a sectional view of another display panel with a reflective layer, in accordance with some embodiments of the present disclosure.
Figure 16A:
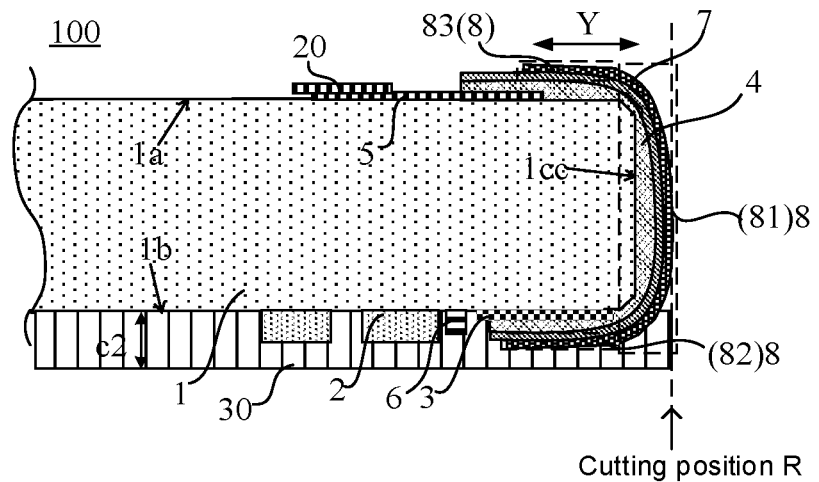
FIG. 16A is a sectional view of another display panel with a reflective layer, in accordance with some embodiments of the present disclosure.
Figure 16B:
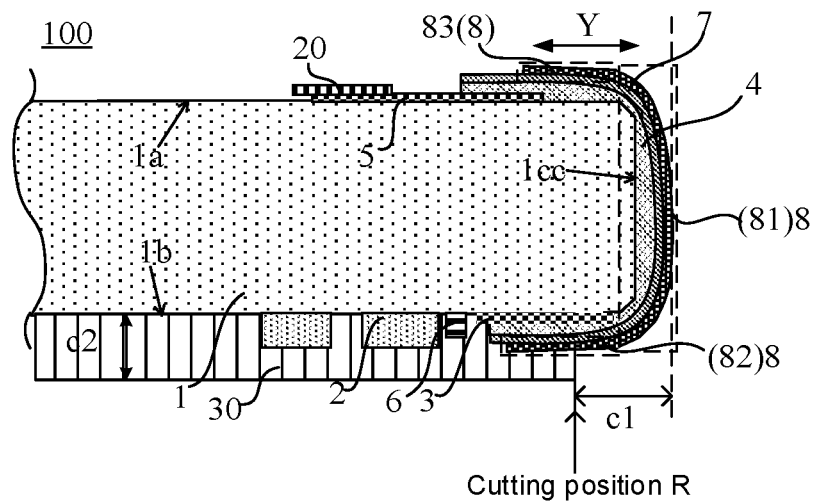
FIG. 16B is a sectional view of another display pane with a reflective layer, in accordance with some embodiments of the present disclosure.

In yet other embodiments, as shown in FIGS. 15 to 16B, the reflective layer 8 further includes a third portion 83. The third portion 83 is disposed on a side, away from the backplane 1, of the portion of the first protective layer 7 located on the first main surface 1a.

In some examples, as shown in FIG. 15, the reflective layer 8 includes the first portion 81 and the third portion 83. In the laser cutting process for forming the second protective layer 30, a direction along which the laser light is irradiated may point from the first main surface 1a to the second main surface 1b, or from the second main surface 1b the first main surface 1a. In this way, as for the second protective layer 30 formed by cutting, the border of the second protective layer 30 proximate to the selected side surface 1cc is flush or substantially flush with the plane where the portion of the reflective layer 8 on the side sub-surface 1c1 is located. In the laser cutting process, in the case where the direction along which the laser light is irradiated points from the first main surface 1a to the second main surface 1b, the third portion 83 of the reflective layer 8 may reflect laser light incident on the first main surface 1a of the backplane in a case of the extensive laser energy, thereby preventing the laser light from causing damage to film layers located on the first main surface 1a, and further protecting the plurality of connecting leads 4 on the side selected surface.

In some other examples, as shown in FIGS. 16A and 16B, the reflective layer 8 includes the first portion 81, the second portion 82 and the third portion 83. In the laser cutting process for forming the second protective layer 30, the direction along which the laser light is irradiated may point from the first main surface 1a to the second main surface 1b, or from the second main surface 1b to the first main surface 1a.

As shown in FIG. 16A, in the case where the direction along which the laser light is irradiated points from the first main surface 1a to the second main surface 1b, the border of the cut second protective layer 30 proximate to the selected side surface 1cc is flush or substantially flush with the plane where the portion of the reflective layer 8 on the side sub-surface 1c1 is located. With continued reference to FIGS. 16A and 16B, in a case where the laser light is irradiated along the direction pointing from the second main surface 1b to the first main surface 1a, the border of the cut second protective layer 30 proximate to the selected side surface 1cc is flush or substantially flush with the plane where the portion of the reflective layer 8 on the side sub-surface 1c1 is located; alternatively, the border of the second protective layer 30 proximate to the selected side surface 1cc corresponds to the second portion 82 of the reflective layer 8, and the distance between the border of the second protective layer 30 proximate to the selected side surface 1cc and the plane where the first portion 81 of the reflective layer 8 is located is in a range from 20 μm to 30 μm, inclusive.

A material of the reflective layer 8 may be a material having a high reflective property. For example, the material of the reflective layer 8 includes metal. For example, the material of the reflective layer 8 includes metal with reflectivity greater than 80% or alloy with reflectivity greater than 80%, so as to reflect infrared laser light incident on the reflective layer 8, and prevent the infrared laser light from causing damage to the first protective layer 7, which may cause the plurality of connecting leads 4 located inside the first protective layer 7 to be exposed to the air.

In some examples, the material of the reflective layer 8 includes any of copper, molybdenum, titanium, silver and gold. For example, the material of the reflective layer 8 is copper. Alternatively, the material of the reflective layer 8 is titanium.

In some embodiments, a thickness of the reflective layer 8 is in a range from 80 nm to 200 nm, inclusive. For example, the thickness of the reflective layer 8 is 80 nm, 100 nm, 120 nm. In this way, the reflective layer 8 may reflect more infrared laser energy, so as to avoid the laser light cutting the first protective layer 7 and avoid the exposure of the plurality of connecting leads 4. Moreover, it will not affect the narrow-bezel effect of the tiled display apparatus.

The display panel 10 provided by some embodiments of the present disclosure includes the reflective layer 8, and thus when a material layer of the second protective layer 30 (i.e., the second protective film) is cut by the laser light, the reflective layer 8 may reflect the laser light incident on a surface thereof, so as to avoid the damage to the first protective layer and the plurality of connecting leads 4 on the selected side surface, thereby protecting the plurality of connecting leads 4 on the selected side surface. In addition, since the reflective layer 8 is provided, the cutting position R on the material layer of the second protective layer 30 may be proximate to the display panel 10 as much as possible, so that the border of the second protective layer 30 proximate to the selected side surface 1cc is flush or substantially flush with the plane where the portion of the reflective layer 8 on the side sub-surface 1c1 is located, or the border of the second protective layer 30 proximate to the selected side surface 1cc corresponds to the second main surface 1b. As a result, a size of an extension of the second protective layer 30 relative to a border of the display panel 10 may be reduced. Therefore, in the process that the plurality of display apparatuses are tiled together, it is possible to avoid a reduction of the flatness caused by, for example, mutual extrusion of borders of the two adjacent second protective layers 30 in the tiled seam of the adjacent display apparatuses, the mutual extrusion of borders is due to that the border of the second protective layer 30 far exceeds the border of the display panel 10. As a result, the yield of the product may be improved.

In some embodiments, as shown in FIGS. 12 to 20, a surface of the second protective layer 30 away from the second main surface 1b is substantially parallel to the second main surface 1b. That is, the surface of the second protective layer 30 is flat.

For example, a thickness of the second protective layer 30 is in a range from 200 μm to 400 μm, inclusive. It will be noted that a thickness of the light-emitting device 2 is less than the thickness of the second protective layer 30. For example, the thickness of the light-emitting device 2 is in a range of 100 μm to 200 μm, inclusive, or even less than 100 μm, such as 80 μm or 50 μm. A total thickness of the connecting lead 4, the first protective layer 7 and the reflective layer 8 that are sequentially stacked is roughly not more than 20 μm. That is, the total thickness of the connecting lead 4, the first protective layer 7 and the reflective layer 8 that are located on the second main surface 1b is roughly not more than 20 μm. Thus, in a case where the second protective layer 30 is attached to the second main surface 1b, a thickness of elements disposed on the second main surface 1b will not affect the flatness of the surface of the second protective layer 30 away from the second main surface 1b.

In some embodiments, as shown in FIGS. 17 to 20, the display panel 10 further includes a third protective layer 9. The third protective layer 9 covers at least the first portion 81 of the reflective layer 8.

Figure 17:
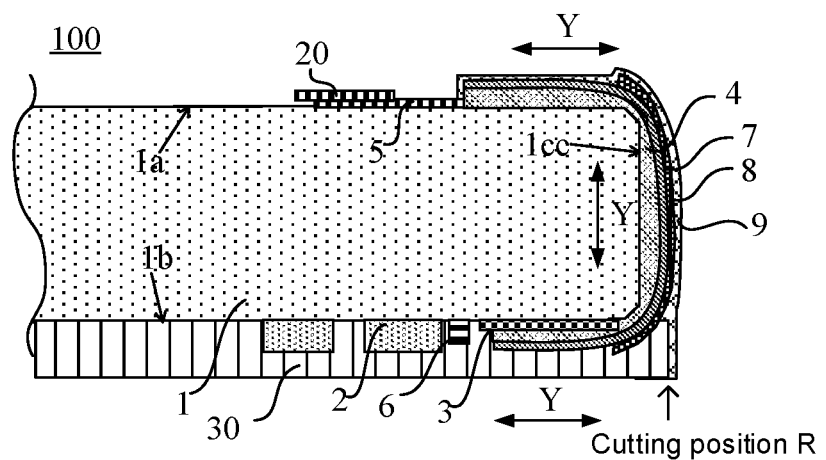
FIG. 17 is a sectional view of yet another display panel with another protective layer, in accordance with some embodiments of the present disclosure.

In some examples, as shown in FIG. 17, in the case where the reflective layer 8 only includes the first portion 81, the third protective layer 9 is a continuous film layer covering a portion of the first protective layer 7 on the first main surface 1a, the first portion 81 of the reflective layer 8 and a surface of an end of the second protective layer 30 proximate to the selected side surface 1cc.

Figure 18:
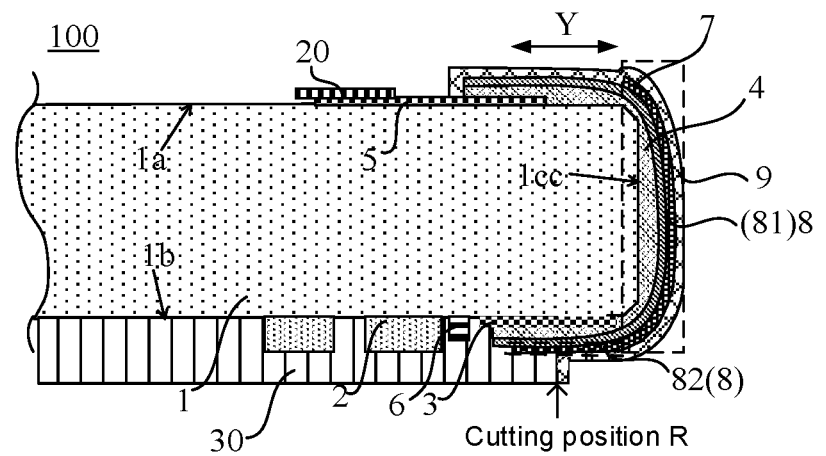
FIG. 18 is a sectional view of yet another display panel with another protective layer, in accordance with some embodiments of the present disclosure.

In some other examples, as shown in FIG. 18, in a case where the reflective layer 8 includes the first portion 81 and the second portion 82, and the border of the second protective layer 30 proximate to the selected side surface 1cc corresponds to the second portion 82 of the reflective layer 8, the third protective layer 9 further covers the second portion 82. Thus, the third protective layer 9 is a continuous film layer covering the portion of the first protective layer 7 on the first main surface 1a, the first portion 81 of the reflective layer 8 and a portion of the second portion 82 of the reflective layer 8, and the surface of the end of the second protective layer 30 proximate to the selected side surface 1cc.

Figure 19:
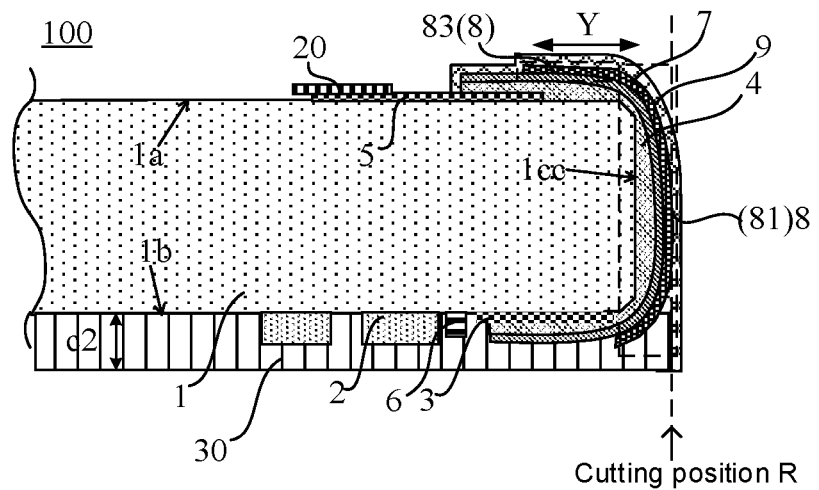
FIG. 19 is a sectional view of yet another display panel with another protective layer, in accordance with some embodiments of the present disclosure.

In yet other examples, as shown in FIG. 19, in a case where the reflective layer 8 includes the first portion 81 and the third portion 83, and the border of the second protective layer 30 proximate to the selected side surface 1cc is flush or substantially flush with the plane where the first portion 81 of the reflective layer 8 is located, the third protective layer 9 further covers the third portion 83. Thus, the third protective layer 9 is a continuous layer covering the portion of the first protective layer 7 on the first main surface 1a, the first portion 81 and the third portion 83 of the reflective layer 8, and the surface of the end of the second protective layer 30 proximate to the selected side surface 1cc.

Figure 20:
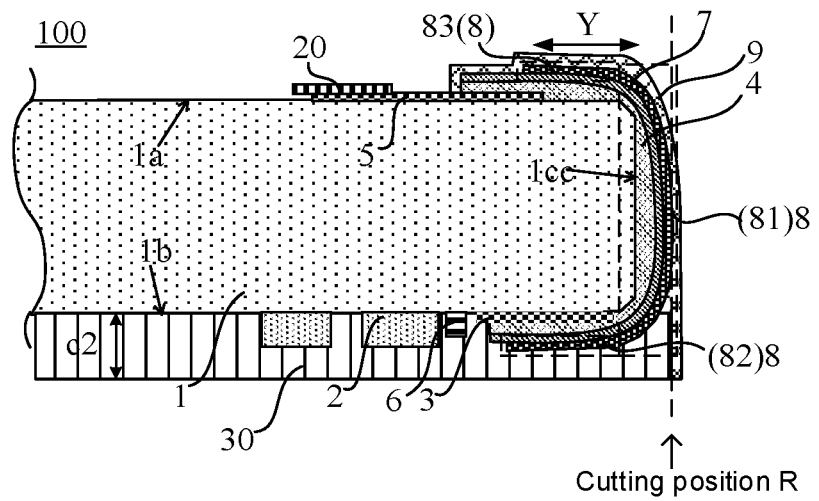
FIG. 20 is a sectional view of yet another display panel with another protective layer, in accordance with some embodiments of the present disclosure.

In yet other examples, as shown in FIG. 20, in a case where the reflective layer 8 includes the first portion 81, the second portion 82 and the third portion 83, and the border of the second protective layer 30 proximate to the selected side surface 1cc is flush or substantially flush with the plane where the first portion 81 of the reflective layer 8 is located, the third protective layer 9 covers the first portion 81 and the third portion 83. Thus, the third protective layer 9 is a continuous layer covering the portion of the first protective layer 7 on the first main surface 1a, the surfaces of the first portion 81 and the third portion 83 of the reflective layer 8, and the surface of the end of the second protective layer 30 proximate to the selected side surface 1cc.

That is, as an outermost film layer of the display panel 10, the third protective layer 9 may cover portions of surfaces of other layers that are exposed to the air, which may further protect the first protective layer, the reflective layer and the side surface of the second protective layer to avoid the corrosion of the water and oxygen, thereby improving the service life of the display panel.

It can be understood that the cutting position R is related to whether the reflective layer 8 includes the second portion 82. In the case where the reflective layer 8 includes the second portion 82, the border of the second protective layer 30 proximate to the selected side surface 1cc may be flush or substantially flush with the plane where the first portion 81 of the reflective layer 8 is located, alternatively, the border of the second protective layer 30 proximate to the selected side surface 1cc may correspond to the second portion 82 of the reflective layer 8. For example, the distance between the border and the plane where the first portion 81 of the reflective layer 8 is located is in a range from 20 μm to 30 μm, inclusive. Thus, coverage ranges of the formed third protective layer 9 corresponding to different conditions are different, which will not be described here again.

In some embodiments, a thickness of the third protective layer 9 is in a range from 3 μm to 5 μm, inclusive. For example, a thickness of a portion of the third protective layer 9 covering the portion of the first protective layer 7 on the first main surface 1a, the first portion 81 (and the second portion 82) of the reflective layer 8, and the surface of the end of the second protective layer 30 proximate to the selected side surface 1cc are 3 μm or 5 μm. In this way, it may be possible to prevent air holes generated due to material properties of the first protective layer 7 itself from adversely affecting the plurality of connecting leads 4 in a case where the first protective layer 7 is made of an organic material, and isolate the reflective layer 8 made of the metal material from the air, thereby further reducing the corrosion of the water and oxygen.

In some examples, a material of the third protective layer 9 has a high hydrophobicity, which may block the outside water and oxygen, thereby preventing the plurality of connecting leads 4 from being corroded. For example, the material of the third protective layer 9 includes a fluoropolymer with hydrofluoroether as a solvent. For example, the third protective layer 9 is a fluorinating agent layer.

It will be noted that, after surfaces of the first protective layer and the reflective layer are coated with a fluorinating agent material, the fluorinating agent material may quickly form a film at a room temperature without any additional curing process, and thus a manufacturing process is simple.

Some embodiments of the present disclosure further provide a method for manufacturing a display panel 10, as shown in FIGS. 21 to 27, the method includes S1 to S7.

Figure 21:
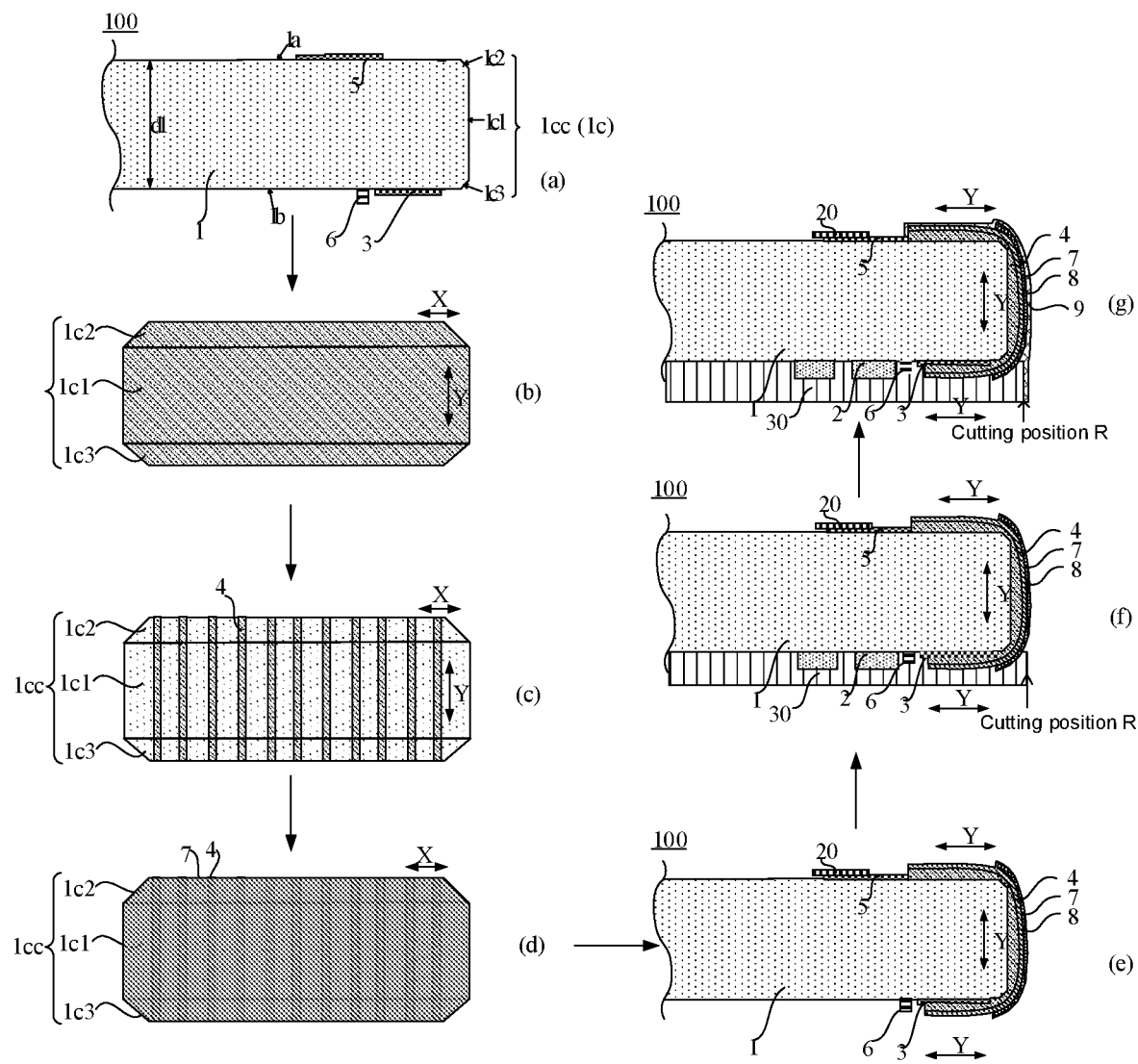
FIG. 21 is a diagram showing steps of a method for manufacturing a display panel, in accordance with some embodiments of the present disclosure.

In S1, as shown in (a) in FIG. 21, a backplane 1 is provided. The backplane 1 includes a first main surface 1a and a second main surface 1b that are opposite, and a plurality of side surfaces 1c each connecting the first main surface 1a with the second main surface 1b. At least one side surface of the plurality of side surfaces 1c is as a selected side surface 1cc.

In S2, as shown in (b) and (c) in FIG. 21, a plurality of connecting leads 4 are formed on the first main surface 1a, the selected side surface 1cc and the second main surface 1b, each connecting lead 4 of the plurality of connecting leads 4 sequentially passes through the selected side surface 1cc and the second main surface 1b from the first main surface 1a. Each connecting lead 4 includes at least a main conductive pattern 4c.

For example, a description that the plurality of connecting leads 4 are formed on the first main surface 1a, the selected side surface 1cc and the second main surface 1b in S2, includes S21 to S22.

In S21, as shown in (b) in FIG. 21, metal layer(s) are formed on the first main surface 1a, the selected side surface 1cc, and the second main surface 1b of the backplane.

For example, the metal layer(s) may be deposited by using an electroplating process, an evaporation process, a silver adhesive pad printing process, a sputtering process (e.g., a multi-arc magnetron sputtering process) or the like, so that the metal layer(s) are formed on the first main surface 1, the selected side surface 1cc and second main surface 1b of the backplane 1.

In some embodiments, the metal layer(s) include a first buffer conductive layer, a main conductive layer and a second buffer conductive layer. The first buffer conductive layer, the main conductive layer and the second buffer conductive layer are sequentially deposited by using the above process, so that three metal layers that are stacked are obtained. The first buffer conductive layer is closer to the backplane 1 than the main conductive layer. For example, a thickness of the first buffer conductive layer is in a range from 30 nm to 70 nm, inclusive, a thickness of the second buffer conductive layer is in a range from 50 nm to 120 nm, inclusive, and a thickness of the main conductive layer is in a range from 0.4 μm to 1 μm, inclusive.

For example, the first buffer conductive layer and the second buffer conductive layer are made of a same material. A material of the first buffer conductive layer includes any of Ti, Ge, Mo and MoNb. A material of the second buffer conductive layer includes any of Ti, Ge, Mo and MoNb. A material of the main conductive layer has a strong electrical conductivity, for example, the material thereof is Cu.

In S22, as shown in (c) in FIG. 21, the metal layer(s) are patterned to obtain the plurality of connecting leads 4. Each connecting lead 4 of the plurality of connecting leads 4 sequentially passes through the selected side surface 1cc and the second main surface 1b from the first main surface 1a of the backplane 1.

In some examples, the metal layer(s) are patterned by using a laser-etching process with high precision to obtain the plurality of connecting leads 4. Thus, the main conductive pattern 4c on an etched interface of each connecting lead 4 are exposed, and each connecting lead 4 includes the first buffer conductive pattern 4a, the main conductive pattern 4c and the second buffer conductive pattern 4b that are sequentially stacked.

In S3, a first protective layer 7 is formed, and the first protective layer 7 covers the plurality of connecting leads 4.

In some examples, as shown in (d) in FIG. 21, the first protective layer 7 is an over coating (OC) adhesive or an ink layer. In some examples, the first protective layer 7 may be formed by a spraying process, a deposition process, or the like.

For example, a material of the first protective layer 7 is formed, by using a deposition process, on a side of the plurality of connecting leads 4 away from the backplane 1 and the surface of the backplane 1 in gaps between the plurality of connecting leads 4, so that the first protective layer 7 as a whole continuously covering the plurality of connecting leads 4, a portion of the first main surface 1a, the selected side surface 1cc and a portion of the second main surface 1b is formed.

In some embodiments, thicknesses of portions of the formed first protective layer 7 disposed on the first main surface 1a, the selected side surface 1c and the second main surface 1b are each in a range from 5 μm to 8 μm, inclusive.

In S4, a reflective layer 8 is formed. The reflective layer 8 includes at least a first portion 81 covering a portion of the first protective layer 7 located on the selected side surface 1cc.

In some embodiments, forming the reflective layer 8 includes that a metal material is sputtered at least on a side, away from the backplane 1, of the portion of the first protective layer 7 located on the selected side surface 1cc, so that the reflective layer 8 is formed. The sputtering process is used to from the reflective layer 8 on the side, away from the backplane 1, of the portion of the first protective layer 7 located on the selected side surface 1cc, so that the reflective layer 8 continuously and entirely covers the portion of the first protective layer 7 located on the selected side surface 1cc. Thus, in a laser cutting process, laser light is incident on the reflective layer 8 and a large amount of energy is reflected by the reflective layer 8, so that the reflective layer 8 may well protect the first protective layer 7 and the plurality of connecting leads 4 inside the reflective layer 8.

In some examples, as shown in (e) in FIG. 21, the reflective layer 8 includes the first portion 81 disposed on the selected side surface 1cc of the backplane 1. The selected side surface 1cc includes a side sub-surface 1c1 perpendicular or substantially perpendicular to the first main surface 1a and the second main surface 1b, a first transition sub-surface 1c2 connects the first main surface 1a with the side sub-surface 1c1, and a second transition sub-surface 1c3 connects the second main surface 1b with the side sub-surface 1c1. Thus, the first portion 81 of the reflective layer 8 includes portions respectively located on the side sub-surface 1c1, the first transition sub-surface 1c2 and the second transition sub-surface 1c3.

Forming the reflective layer 8 includes S4-1, in which a metal material is sputtered on a side, away from the backplane 1, of the portions of the first protective layer 7 respectively located on the side sub-surface 1c1, the first transition sub-surface 1c2, and the second transition sub-surface 1c3, so as to form the reflective layer 8.

In some other examples, the reflective layer 8 further includes a second portion 82 disposed on the second main surface 1b. As shown in FIGS. 14A and 14B, the reflective layer 8 includes the first portion 81 and the second portion 82. The first portion 81 is disposed on the side, away from the backplane 1, of the portion of the first protective layer 7 located on the selected side surface 1cc. The second portion 82 is disposed on a side, away from the backplane 1, of a portion of the first protective layer 7 located on the second main surface 1b.

Forming the reflective layer 8 includes S4-2, in which a metal material is sputtered on a side, away from the backplane 1, of the portions of the first protective layer 7 located on the selected side surface 1cc and the second main surface 1b, so as to form the reflective layer 8.

In yet other examples, the reflective layer 8 further includes a third portion 83 on the first main surface 1a. As shown in FIG. 15, the reflective layer 8 includes the first portion 81 and the third portion 83.

Forming the reflective layer 8 includes S4-3, in which a metal material is sputtered on a side, away from the backplane 1, of the portions of the first protective layer 7 located on the selected side surface 1cc and the first main surface 1a, so as to form the reflective layer 8.

Alternatively, as shown in FIGS. 16A and 16B, the reflective layer 8 includes the first portion 81, the second portion 82 and the third portion 83.

Forming the reflective layer 8 includes S4-4, in which a metal material is sputtered on a side, away from the backplane 1, of the portions of the first protective layer 7 located on the selected side surface 1cc, the first main surface 1a, and the second main surface 1b, so as to form the reflective layer 8.

In S5, a plurality of light-emitting devices 2 are formed on the second main surface 1b.

In some embodiments, as shown in (f) in FIG. 21, the method for manufacturing the display panel 10 further includes S6, in which the second protective layer 30 is formed. S6 includes: S61 to S63.

In S61, a second protective film 30' is attached to the second main surface 1b. The second protective film 30' is an initial film formed by a material of the second protective layer 30.

Figure 22:
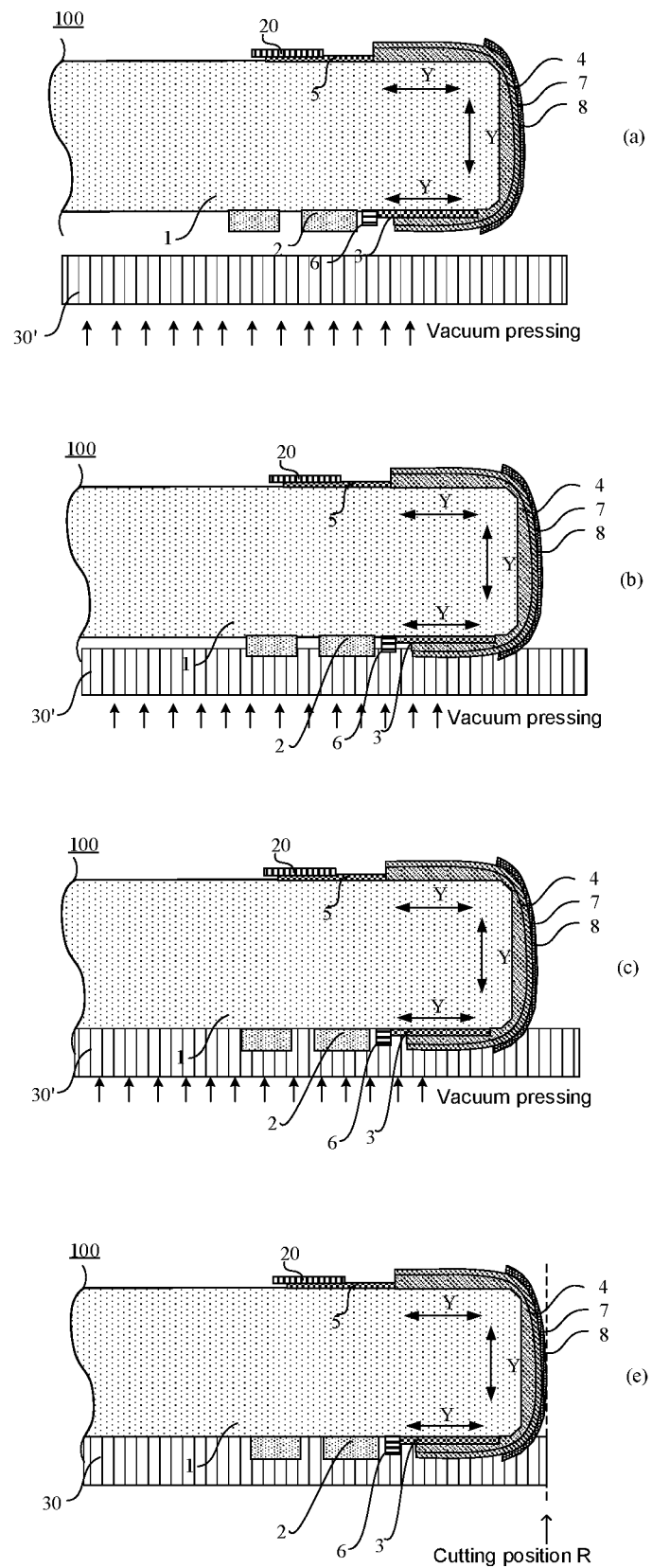
FIG. 22 is a diagram showing steps of another method for manufacturing a display panel, in accordance with some embodiments of the present disclosure.
Figure 23:
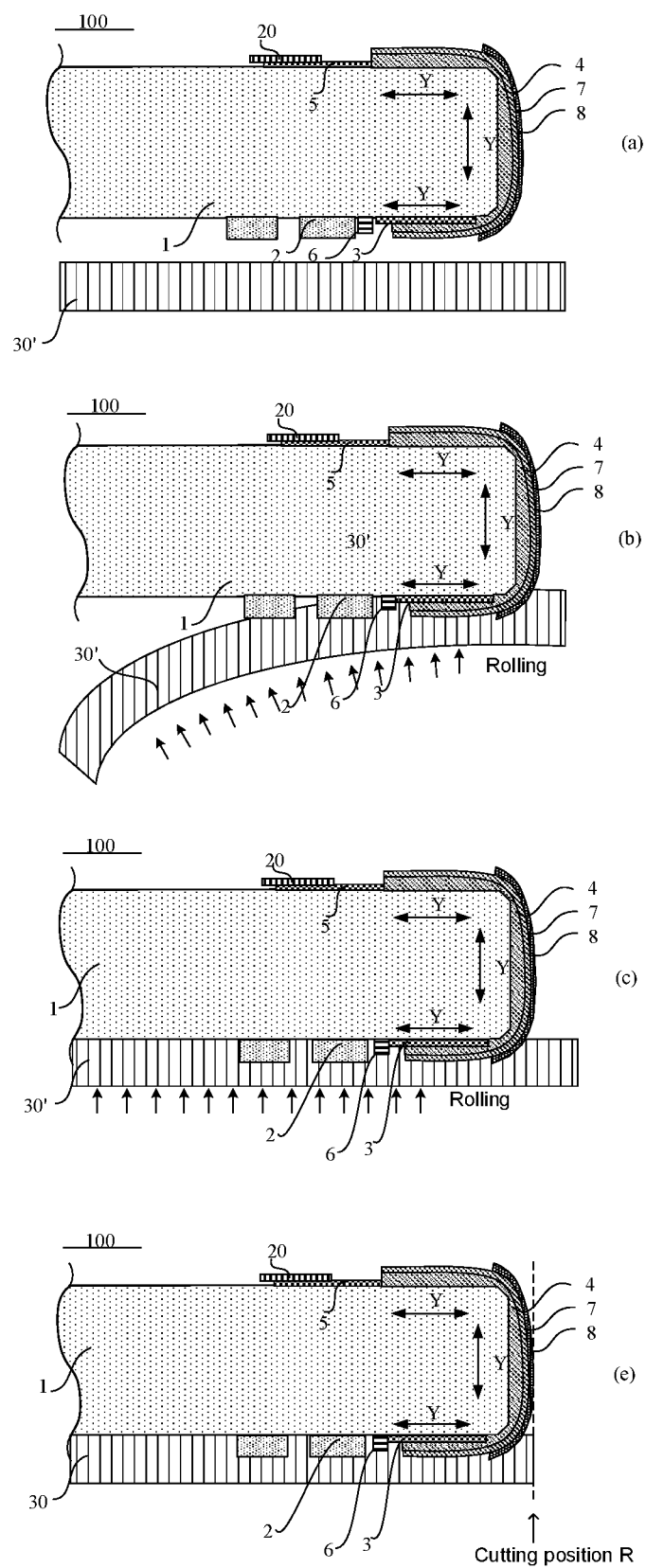
FIG. 23 is a diagram showing steps of yet another method for manufacturing a display panel, in accordance with some embodiments of the present disclosure.
Figure 24:
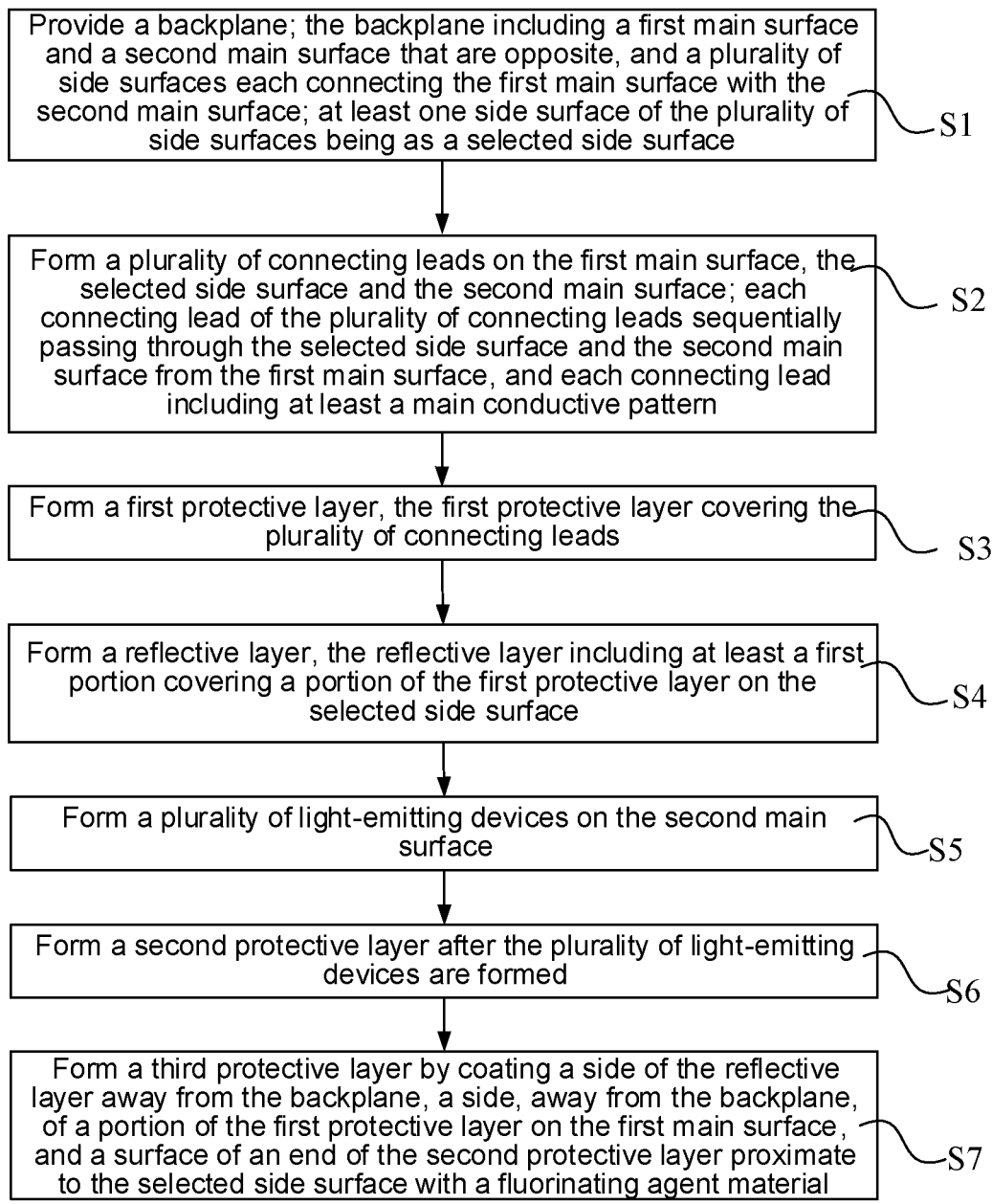
FIG. 24 is a flow diagram of a method for manufacturing a display panel, in accordance with some embodiments of the present disclosure.
Figure 25:
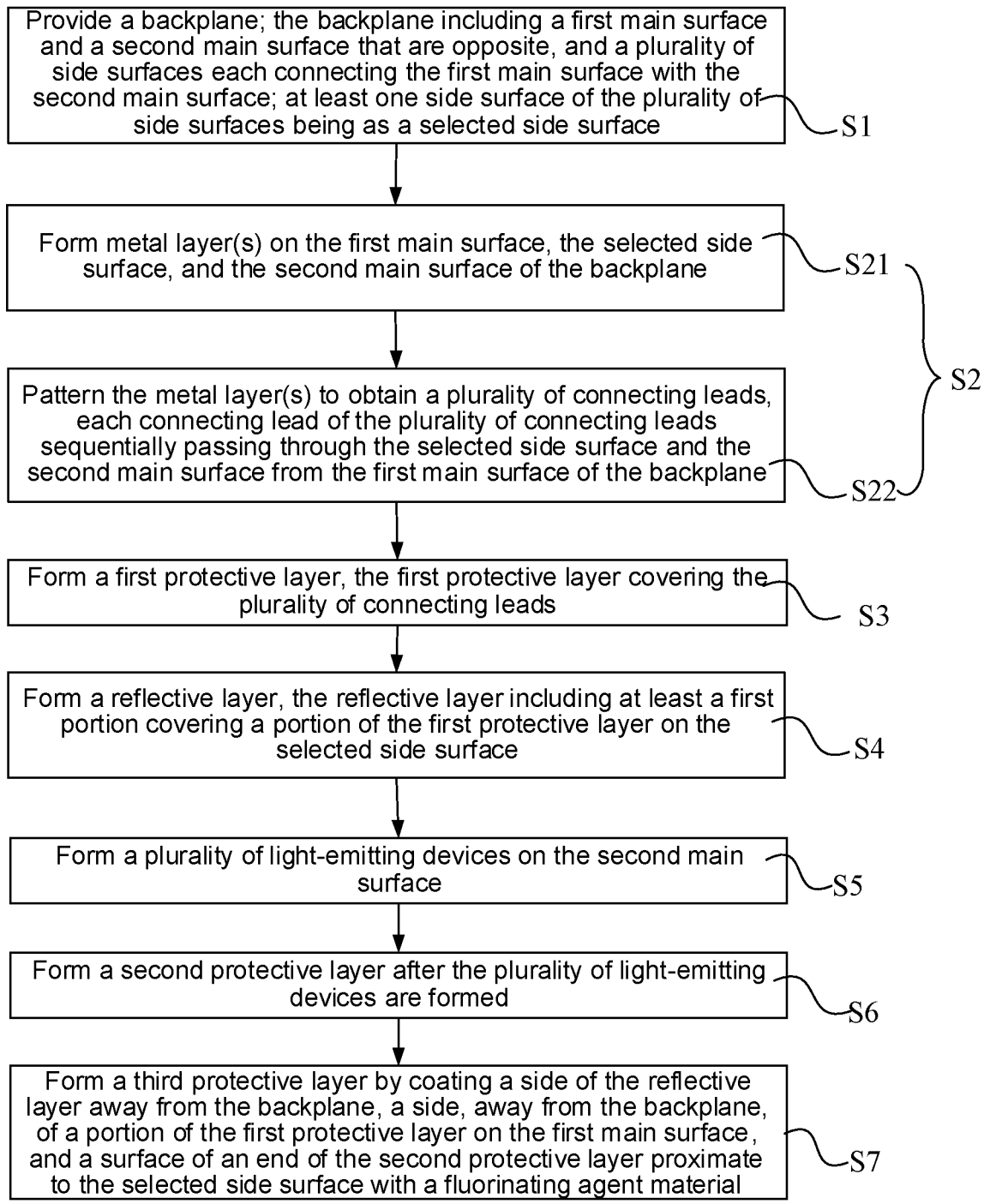
FIG. 25 is a flow diagram of another method for manufacturing a display panel, in accordance with some embodiments of the present disclosure.
Figure 26:
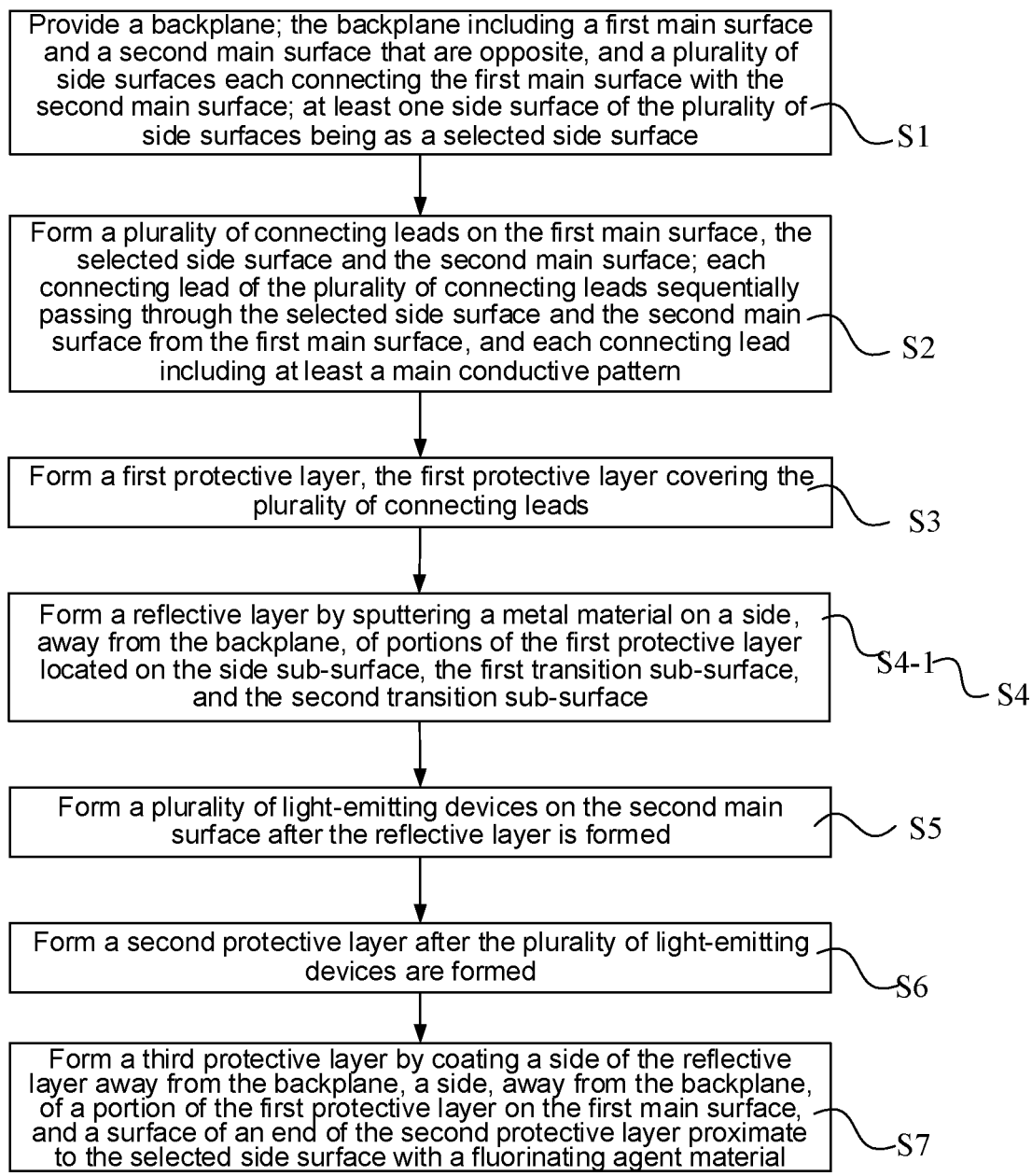
FIG. 26 is a flow diagram of yet another method for manufacturing a display panel, in accordance with some embodiments of the present disclosure.
Figure 27:
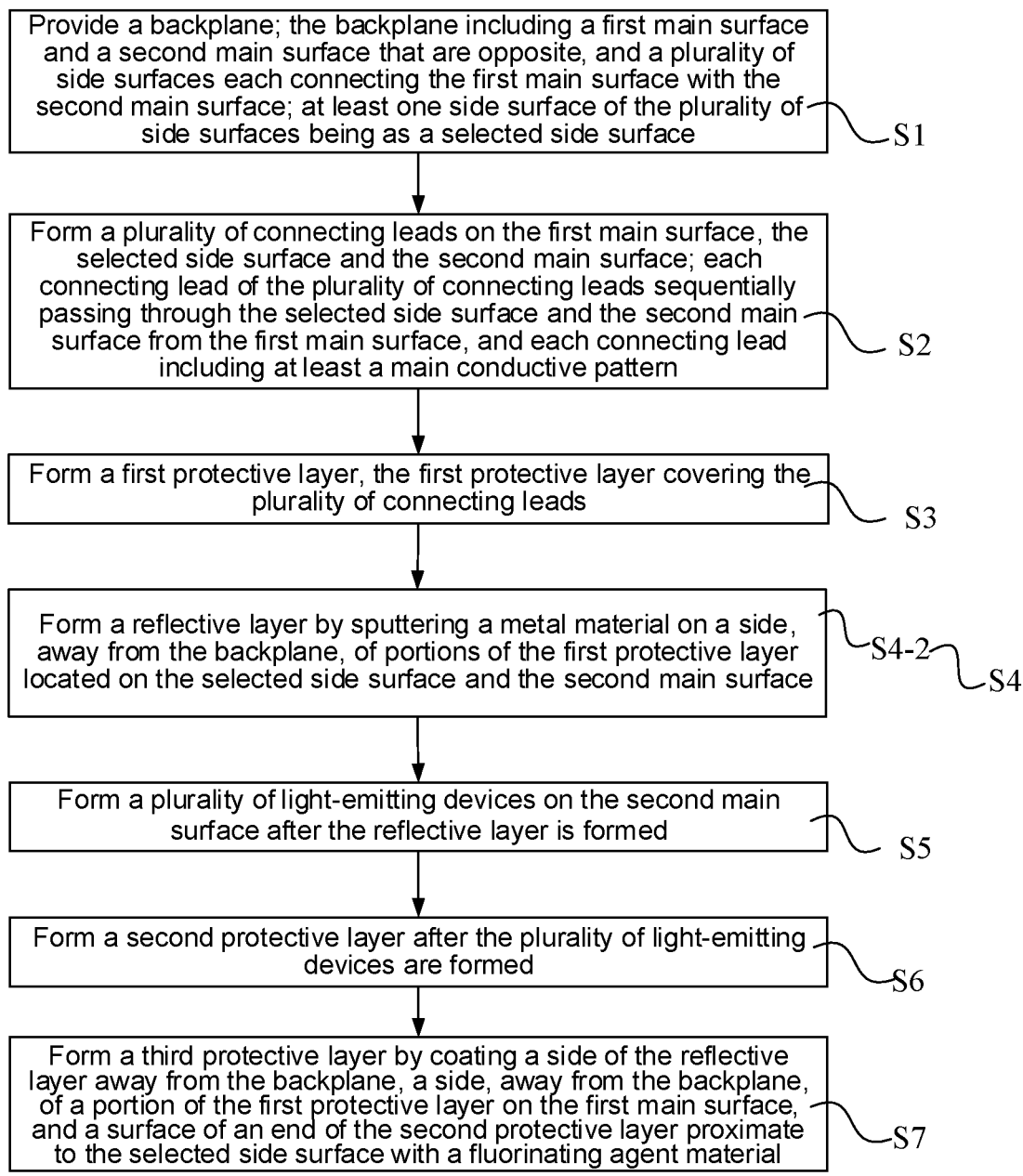
FIG. 27 is a flow diagram of yet another method for manufacturing a display panel, in accordance with some embodiments of the present disclosure.
Figure 28:
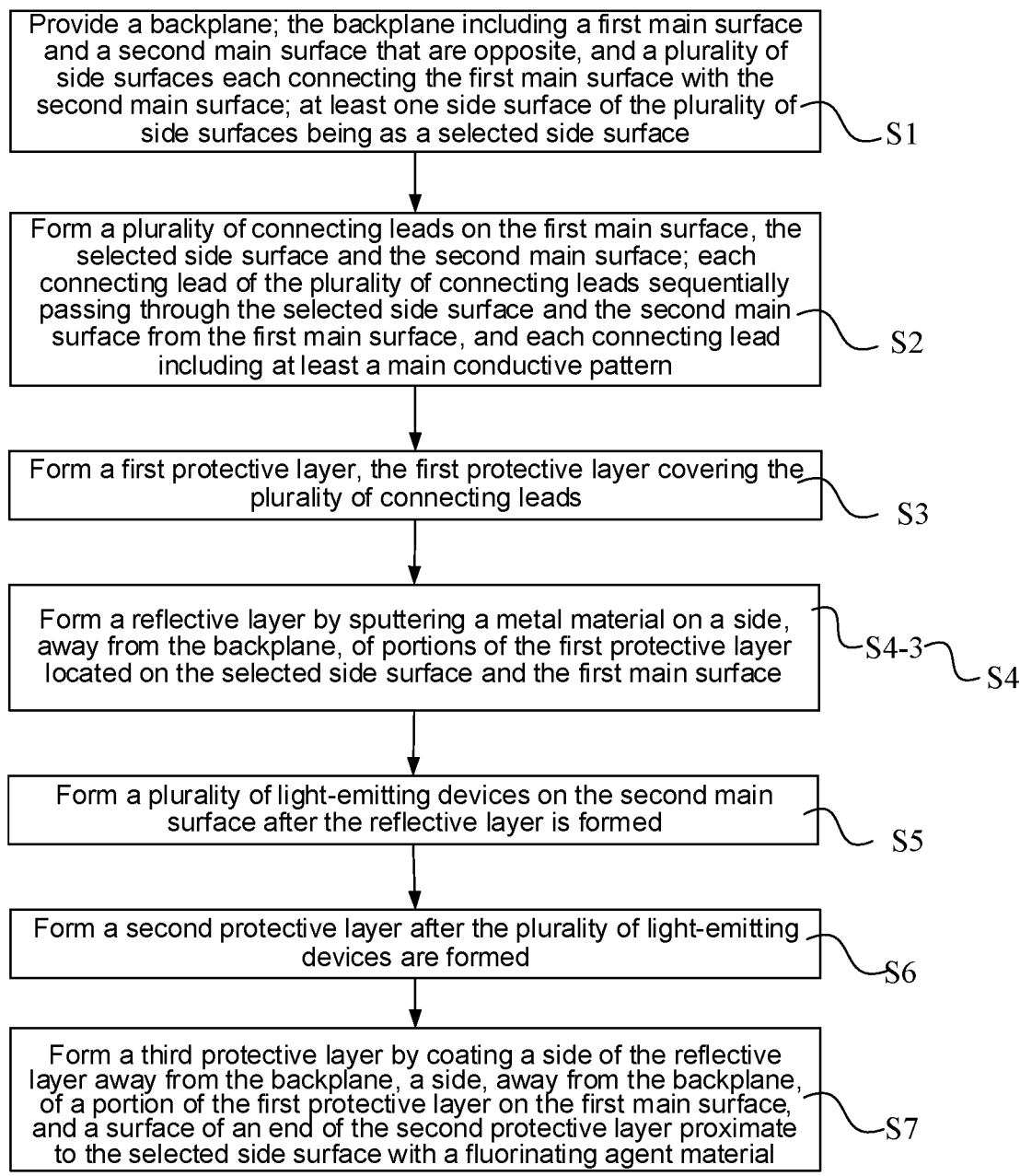
FIG. 28 is a flow diagram of yet another method for manufacturing a display panel, in accordance with some embodiments of the present disclosure.
Figure 29:
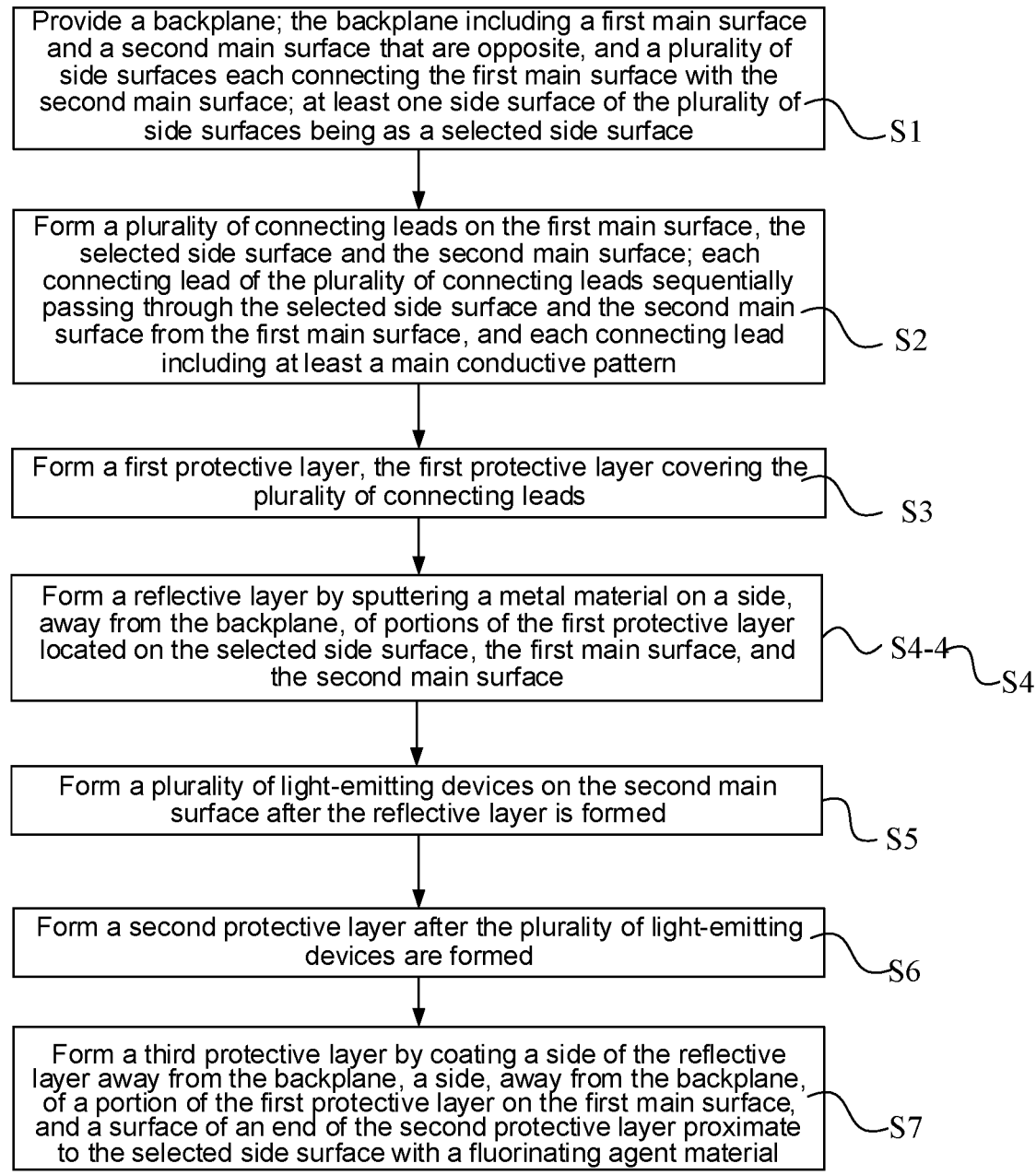
FIG. 29 is a flow diagram of yet another method for manufacturing a display panel, in accordance with some embodiments of the present disclosure.
Figure 30:
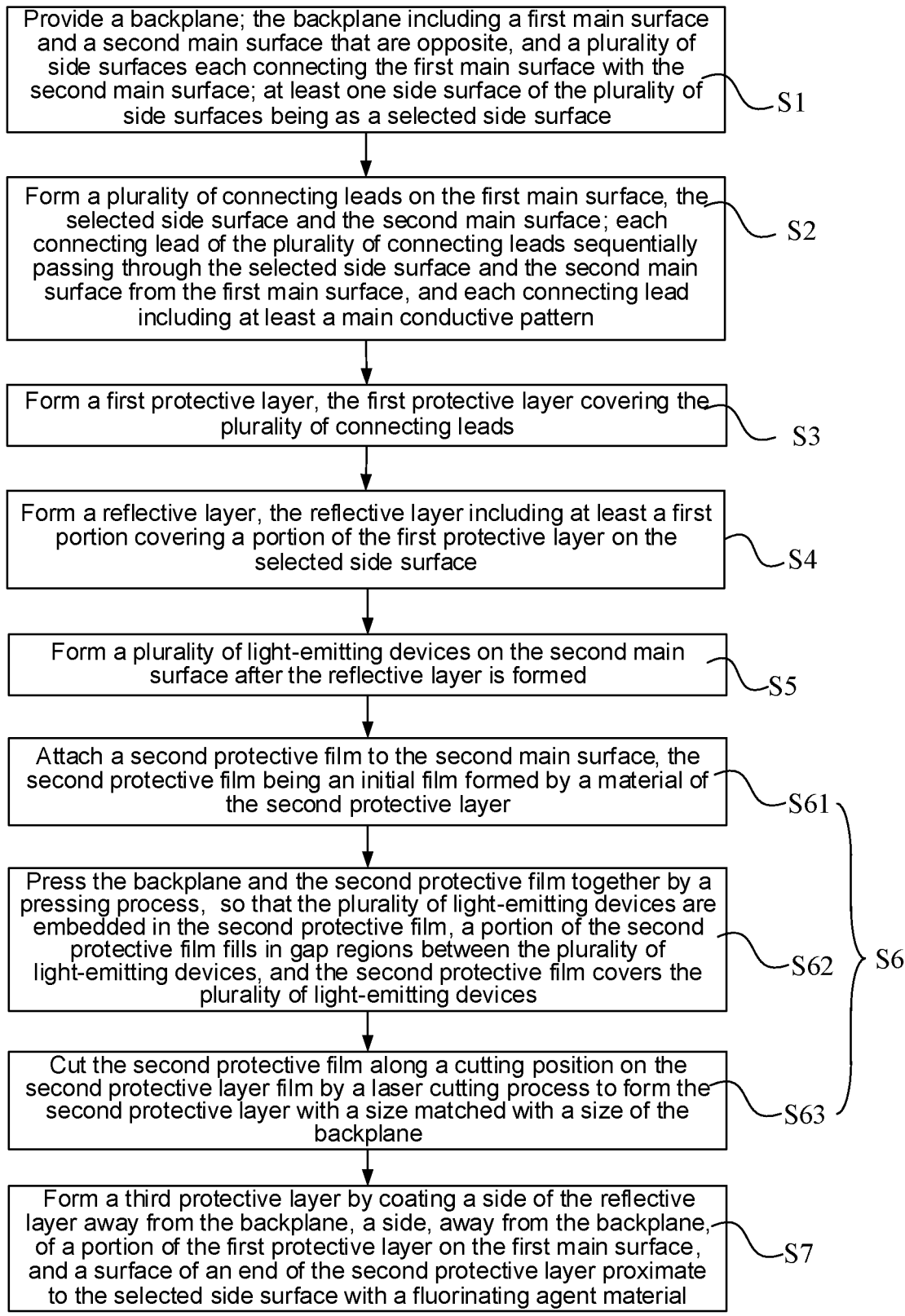
FIG. 30 is a flow diagram of yet another method for manufacturing a display panel, in accordance with some embodiments of the present disclosure.

In S62, as shown in FIGS. 22 and 23, the backplane 1 and the second protective film are pressed together by a pressing process, so that the plurality of light-emitting devices 2 are embedded in the second protective film 30', a portion of the second protective film 30' fills in gap regions between the plurality of light-emitting devices 2, and the second protective film 30' covers the plurality of light-emitting devices 2.

In some embodiments, there are various types of pressing process.

For example, the pressing process may include a vacuum pressing process.

As shown in FIG. 22, in a process of pressing the backplane 1 on which the plurality of light-emitting devices 2 are formed and the second protective film 30' by the vacuum pressing process, the second protective film 30' may be pressed as a whole while performing a vacuumizing operation. In this way, a surface of the second protective film 30' proximate to the plurality of light-emitting devices 2 may be substantially in contact with the plurality of light-emitting devices 2, so that all the plurality of light-emitting devices 2 may substantially extend into and embedded inside the second protective film 30'. In addition, bubbles between the second protective film 30' and the backplane 1 may be further avoided.

For example, the pressing process may include a rolling process.

As shown in FIG. 23, in the process of pressing the backplane 1 on which the plurality of light emitting devices 2 are formed and the second protective film 30' by the rolling process, an end of the backplane 1 (e.g., a right end thereof as shown in FIG. 23) on which the plurality of light-emitting devices 2 are formed and an end of the second protective film 30' (e.g., a right end thereof as shown in FIG. 23) may be pressed firstly, so that light-emitting devices 2 at this end are completely embedded into the second protective film 30'. Subsequently, the pressing position is gradually moved to opposite ends (e.g., left ends as shown in FIG. 23), so that the plurality of light-emitting devices 2 are sequentially embedded into the second protective film 30' from one end of the backplane 1 to the other end. Then a temperature-rising and de-foaming operation is performed. In this way, it may be possible to reduce or even eliminate the bubbles that may be formed between the second protective film 30' and the backplane 1.

In S63, the second protective layer film 30' is cut along a cutting position Ron the second protective film 30' by the laser cutting process to form the second protective layer with a size matched with a size of the backplane 1.

For example, the cutting position R is parallel to a boundary side between the second main surface 1b and the selected side surface 1cc, and the cutting position R is flush with a plane where the first portion 81 of the reflective layer 8 is located. As shown in FIG. 13, in some examples, the reflective layer 8 only includes the first portion 81, and the cutting position R is parallel to a plane where a portion of the reflective layer 8 on the side sub-surface 1c1 is located. Thus, in a process of cutting the second protective film using the laser light, since the first portion 81 of the reflective layer 8 includes the portions located on the side sub-surface 1c1, the first transition sub-surface 1c2 and the second transition sub-surface 1c3, the laser light will not be incident on the first protective layer 7, and the portion of the reflective layer 8 located on the side sub-surface 1c1 will reflect the laser energy.

In some other examples, as shown in FIG. 14, in the case where the reflective layer 8 further includes the second portion 82, the cutting position R is parallel to the boundary side between the second main surface 1b and the selected side surface 1cc, and the cutting position R corresponds to the second portion 82. In the process of cutting the second protective film 30' using the laser light, the laser cutting is performed in a region of the second protective film 30' corresponding to the second portion 82 of the reflective layer 8, and a distance c1 between the cutting position R and the plane where the first portion 81 of the reflective layer 8 is located is in a range from 20 μm to 30 μm, inclusive. Thus, after the plurality of display panels 10 are tiled together, tiled seams between adjacent display panels 10 are relatively small. As a result, depressions will not occur to subsequent film layer(s), and thus a visual effect of the tiled display apparatus 1000 may be great.

Alternatively, a border of the cut second protective layer 30 proximate to the selected side surface 1cc is flush or substantially flush with the plane where the portion of the reflective layer 8 on the side sub-surface 1c1 is located.

In yet other examples, as shown in FIGS. 15 and 16A, in a case where the cutting position R is parallel to the boundary side between the second main surface 1b and the selected side surface 1cc, the cutting position R is flush with the plane where the first portion 81 of the reflective layer 8 is located, and the reflective layer 8 further includes the third portion 83, the second protective film is cut along the cutting position R on the second protective film by using the laser cutting process, and a direction of the laser cutting is from the main surface 1a to the second main surface 1b.

For example, as shown in FIG. 15, the reflective layer 8 includes the first portion 81 and the third portion 83. The direction of the laser cutting is from the first main surface 1a to the second main surface 1b, and the cutting position R of the laser light on the second protective film is flush with the plane where the first portion 81 of the reflective layer 8 is located.

For example, as shown in FIGS. 16A and 16B, the reflective layer 8 includes the first portion 81, the second portion 82 and the third portion 83. The direction of the laser cutting is from the first main surface 1a to the second main surface 1b, and the cutting position R of the laser light on the second protective film is flush with the plane where the first portion 81 of the reflective layer 8 is located. Alternatively, the direction of the laser cutting is from the second main surface 1b to the first main surface 1a, and the cutting position R of the laser light on the second protective film is flush with the plane where the first portion 81 of the reflective layer 8 is located, or the distance between the border of the second protective layer 30 proximate to the selected side surface 1cc and the plane where the side sub-surface 1 is located is in a range from 20 μm to 30 μm, inclusive.

In some embodiments, as shown in (g) in FIG. 21, the method for manufacturing the display panel 10 further includes the following step.

In S7, a third protective layer 9 is formed.

For example, forming the third protective layer 9 includes that a side of the reflective layer 8 away from the backplane 1, a side, away from the backplane 1, of a portion of the first protective layer 7 located on the first main surface 1a, and a surface of an end of the second protective layer 30 proximate to the selected side surface 1cc are coated with a fluorinating agent material, so that the third protective layer 9 is formed.

In some examples, the third protective layer 9 is made of a material having a high hydrophobicity, so as to block the outside water and oxygen, thereby preventing the plurality of connecting leads 4 from being corroded. For example, a material of the third protective layer 9 includes a fluoropolymer with hydrofluoroether as a solvent.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:
   a backplane including a first main surface and a second main surface that are opposite, and a plurality of side surfaces each connecting the first main surface with the second main surface; at least one side surface of the plurality of side surfaces being as a selected side surface;
   a plurality of light-emitting devices disposed on the second main surface of the backplane;
   a plurality of connecting leads disposed on the first main surface, the selected side surface and the second main surface; each connecting lead of the plurality of connecting leads sequentially passing through the selected side surface and the second main surface from the first main surface; the plurality of connecting leads being electrically connected to the plurality of light-emitting devices;
   a first protective layer covering the plurality of connecting leads; and a reflective layer including at least a first portion, the first portion covering a portion of the first protective layer located on the selected side surface.

2. The display panel according to claim 1, wherein the material of the reflective layer includes metal; or the material of the reflective layer includes metal with reflectivity greater than 80% or alloy with reflectivity greater than 80%.

3. The display panel according to claim 1, wherein a thickness of the reflective layer is in a range from 80 nm to 200 nm, inclusive.

4. The display panel according to claim 1, wherein the reflective layer further includes a second portion; the second portion is disposed on a side, away from the backplane, of a portion of the first protective layer located on the second main surface; or
the reflective layer further includes a third portion; the third portion is disposed on a side, away from the backplane, of a portion of the first protective layer located on the first main surface; or
the reflective layer further includes a second portion and a third portion; the second portion is disposed on a side, away from the backplane, of a portion of the first protective layer located on the second main surface; the third portion is disposed on a side, away from the backplane, of a portion of the first protective layer located on the first main surface.

5. The display panel according to claim 1, further comprising a second protective layer disposed on the second main surface of the backplane, wherein
the second protective layer covers the plurality of light-emitting devices and fills gap regions between the plurality of light-emitting devices; and
the second protective layer covers a portion of the first protective layer located on the second main surface.

6. The display panel according to claim 5, wherein a border of the second protective layer proximate to the selected side surface is substantially flush with a plane where the first portion of the reflective layer is located; or
the reflective layer further includes a second portion, the second portion is disposed on a side, away from the backplane, of the portion of the first protective layer located on the second main surface; and the second protective layer covers a portion of the reflective layer located on the second main surface.

7. The display panel according to claim 5, wherein the selected side surface includes a first transition sub-surface, a second transition sub-surface, and a side sub-surface;
the side sub-surface is substantially perpendicular to the first main surface and the second main surface, the first transition sub-surface is connected to the first main surface and the side sub-surface, and the second transition sub-surface is connected to the second main surface and the side sub-surface;
the first portion of the reflective layer includes portions respectively located on the first transition sub-surface, the side sub-surface, and the second transition sub-surface;
the second protective layer covers the portion of the first portion of the reflective layer located on the second transition sub-surface; and
a border of the second protective layer proximate to the selected side surface is substantially flush with a plane where the portion of the first portion of the reflective layer located on the side sub-surface.

8. The display panel according to claim 5, wherein the reflective layer further includes a second portion, the second portion is disposed on a side, away from the backplane, of the portion of the first protective layer located on the second main surface;
the second protective layer is disposed on a side of the second portion of the reflective layer away from the backplane, and a border of the second protective layer proximate to the selected side surface corresponds to the second portion of the reflective layer.

9. The display panel according to claim 8, wherein a distance between the border of the second protective layer proximate to the selected side surface and a plane where the first portion of the reflective layer is located is in a range from 20 μm to 30 μm, inclusive.

10. The display panel according to claim 5, wherein a surface of the second protective layer away from the second main surface is substantially parallel to the second main surface.

11. The display panel according to claim 5, further comprising a third protective layer, wherein
the third protective layer covers at least the first portion of the reflective layer and a portion of the first protective layer located on the first main surface;
the reflective layer further includes a second portion disposed on a side, away from the backplane, of a portion of the first protective layer located on the second main surface, the third protective layer further covers the second portion; and/or the reflective layer further includes a third portion disposed on a side, away from the backplane, of the portion of the first protective layer located on the first main surface, the third protective layer further covers the third portion.

12. The display panel according to claim 11, wherein the third protective layer further covers a surface of an end of the second protective layer proximate to the selected side surface.

13. The display panel according to claim 11, wherein a material of the third protective layer includes a fluorinating agent.

14. The display panel according to claim 11, wherein a thickness of the third protective layer is in a range from 3 μm to 5 μm, inclusive.

15. A display apparatus, comprising:
the display panel according to claim 1; and
a driver circuit board disposed on the first main surface of the backplane of the display panel, the driver circuit board being electrically connected to the plurality of light-emitting devices of the display panel through the plurality of connecting leads of the display panel.

16. A tiled display apparatus, comprising a plurality of display apparatuses each according to claim 15, the plurality of display apparatuses being tiled together.

17. A method for manufacturing a display panel, comprising:
providing a backplane; the backplane including a first main surface and a second main surface that are opposite, and a plurality of side surfaces each connecting the first main surface with the second main surface; and at least one side surface of the plurality of side surfaces being as a selected side surface;
forming a plurality of connecting leads on the first main surface, the selected side surface and the second main surface; each connecting lead of the plurality of connecting leads sequentially passing through the selected side surface and the second main surface from the first main surface;

forming a first protective layer on a side of the plurality of connecting leads away from the backplane, the first protective layer covering the plurality of connecting leads;

forming a reflective layer on a side of the first protective layer away from the backplane, the reflective layer including at least a first portion covering a portion of the first protective layer on the selected side surface; and forming a plurality of light-emitting devices on the second main surface, the plurality of light-emitting devices being electrically connected to the plurality of connecting leads.

18. The method for manufacturing the display panel according to claim 17, wherein forming the reflective layer on the side of the first protective layer away from the backplane, includes:

sputtering a metal material at least on a side, away from the backplane, of a portion of the first protective layer located on the selected side surface to form the reflective layer; or the reflective layer further includes a second portion located on a side, away from the backplane, of a portion of the first protective layer located on the second main surface; and forming the reflective layer on the side of the first protective layer away from the backplane, includes:

sputtering a metal material on a side, away from the backplane, of portions of the first protective layer located on the selected side surface and the second main surface to form the reflective layer; or the reflective layer further includes a third portion located on a side, away from the backplane, of a portion of the first protective layer located on the first main surface; and forming the reflective layer on the side of the first protective layer away from the backplane, includes:

sputtering a metal material on a side, away from the backplane, of portions of the first protective layer located on the selected side surface and the first main surface to form the reflective layer; or the reflective layer further includes a second portion and a third portion; the second portion being located on a side, away from the backplane, of a portion of the first protective layer located on the second main surface; the third portion being located on a side, away from the backplane, of a portion of the first protective layer located on the first main surface; and forming the reflective layer on the side of the first protective layer away from the backplane, includes:

sputtering a metal material on a side, away from the backplane, of portions of the first protective layer located on the selected side surface, the second main surface and the first main surface to form the reflective layer.

19. The method for manufacturing the display panel according to claim 18, further comprising: forming a second protective layer after forming the plurality of light-emitting devices on the second main surface; wherein forming the second protective layer, includes:

attaching a second protective film on the second main surface;

pressing the backplane and the second protective film together using a pressing process; and cutting the second protective film along a cutting position on the second protective film using a laser cutting process to form the second protective layer with a size matched with a size of the backplane; wherein the cutting position is parallel to a boundary side between the second main surface and the selected side surface, and the cutting position is substantially flush with a plane where the first portion of the reflective layer is located;

or the reflective layer further includes a second portion located on a side, away from the backplane, of a portion of the first protective layer located on the second main surface, the cutting position is parallel to a boundary side between the second main surface and the selected side surface, and the cutting position corresponds to the second portion.

20. The method for manufacturing the display panel according to claim 19, further comprising: forming a third protective layer after forming the second protective layer; wherein forming the third protective layer, includes:

coating a side of the reflective layer away from the backplane, a side, away from the backplane, of a portion of the first protective layer located on the first main surface, and a surface of an end of the second protective layer proximate to the selected side surface with a fluorinating agent material to form the third protective layer.

* * * * *